United States Patent
Sandstrom et al.

(10) Patent No.: US 7,346,093 B2
(45) Date of Patent: Mar. 18, 2008

(54) DUV LIGHT SOURCE OPTICAL ELEMENT IMPROVEMENTS

(75) Inventors: Richard L. Sandstrom, Encinitas, CA (US); John Martin Algots, San Diego, CA (US); Joshua C. Brown, Escondido, CA (US); Raymond F. Cybulski, San Diego, CA (US); John Dunlop, San Diego, CA (US); James K. Howey, Vista, CA (US); Richard G. Morton, San Diego, CA (US); Xiaojiang Pan, San Diego, CA (US); William N. Partlo, Poway, CA (US); Firas F. Putris, La Mesa, CA (US); Tom A. Watson, Carlsbad, CA (US); Thomas A. Yager, Encinitas, CA (US)

(73) Assignee: Cymer, Inc., San Diego, CA (US)

( * ) Notice: Subject to any disclaimer, the term of this patent is extended or adjusted under 35 U.S.C. 154(b) by 372 days.

(21) Appl. No.: 10/808,157

(22) Filed: Mar. 23, 2004

(65) Prior Publication Data

US 2004/0240506 A1 Dec. 2, 2004

Related U.S. Application Data

(63) Continuation-in-part of application No. 10/173,190, filed on Jun. 14, 2002, now Pat. No. 6,750,972, which is a continuation-in-part of application No. 10/141,201, filed on May 7, 2002, now Pat. No. 6,839,372, and a continuation-in-part of application No. 10/000,991, filed on Nov. 14, 2001, now Pat. No. 6,795,474, and a continuation-in-part of application No. 09/716,041, filed on Nov. 17, 2000, now Pat. No. 6,778,584, and a continuation-in-part of application No. 09/854,097, filed on May 11, 2001, now Pat. No. 6,757,316.

(51) Int. Cl.
*H01S 3/08* (2006.01)
*H01S 3/22* (2006.01)

(52) U.S. Cl. .................................. 372/107; 372/55
(58) Field of Classification Search ................. 372/99, 372/102–103, 107, 55; 359/822
See application file for complete search history.

(56) References Cited

U.S. PATENT DOCUMENTS 2,759,106 A  8/1956  Wolter ........................ 250/53

(Continued)

OTHER PUBLICATIONS

U.S. Appl. No. 10/608,521, filed Jun. 26, 2003, Rafac et al.
Apruzese, J.P., "X-Ray Laser Research Using Z Pinches," *Am. Inst. of Phys.* 399-403, (1994).

(Continued)

*Primary Examiner*—Minsun Oh-Harvey
*Assistant Examiner*—Phillip Nguyen
(74) *Attorney, Agent, or Firm*—William C. Cray

(57) ABSTRACT

A high power narrow band, high repetition rate laser light source optical improvement apparatus and methods are disclosed with a fast angularly positionable mirror having a mirror mounting frame, a reflective optic with a coefficient different from that of the mounting frame, at least one flexure mount fromed in the mounting frame that is flexible having flexure arm attached the flexture to the mounting frame. The apparatus may include a flexure force mechanism having an elongated rod. The force mechanism may pre-stress the flexure. The mirror maybe a grating which includes a substrate with metallic layer formed on the substrate, and a protective coating made of silica formed on the reflective metallic layer. The grating maybe actively tuned using an electro- or magneto-sensitive element. Oxides of the metal in the reflective layer may be removed by a hydrogen purge system exposed to deep ultraviolet radiation.

46 Claims, 18 Drawing Sheets

U.S. PATENT DOCUMENTS

| | | | | |
|---|---|---|---|---|
| 3,150,483 | A | 9/1964 | Mayfield et al. | 60/35.5 |
| 3,232,046 | A | 2/1966 | Meyer | 50/35.5 |
| 3,279,176 | A | 10/1966 | Boden | 60/202 |
| 3,746,870 | A | 7/1973 | Demarest | 250/227 |
| 3,960,473 | A | 6/1976 | Harris | 425/467 |
| 3,961,197 | A | 6/1976 | Dawson | 250/493 |
| 3,969,628 | A | 7/1976 | Roberts et al. | 250/402 |
| 4,042,848 | A | 8/1977 | Lee | 313/231.6 |
| 4,088,966 | A | 5/1978 | Samis | 313/231.5 |
| 4,143,275 | A | 3/1979 | Mallozzi et al. | 250/503 |
| 4,162,160 | A | 7/1979 | Witter | 75/246 |
| 4,203,393 | A | 5/1980 | Giardini | 123/30 |
| 4,504,964 | A | 3/1985 | Cartz et al. | 378/119 |
| 4,536,884 | A | 8/1985 | Weiss et al. | 378/119 |
| 4,538,291 | A | 8/1985 | Iwamatsu | 378/119 |
| 4,596,030 | A | 6/1986 | Herziger et al. | 378/119 |
| 4,618,971 | A | 10/1986 | Weiss et al. | 378/34 |
| 4,626,193 | A | 12/1986 | Gann | 431/71 |
| 4,633,492 | A | 12/1986 | Weiss et al. | 378/119 |
| 4,635,282 | A | 1/1987 | Okada et al. | 378/34 |
| 4,751,723 | A | 6/1988 | Gupta et al. | 378/119 |
| 4,752,946 | A | 6/1988 | Gupta et al. | 378/119 |
| 4,837,794 | A | 6/1989 | Riordan et al. | 378/119 |
| 5,023,897 | A | 6/1991 | Neff et al. | 378/122 |
| 5,027,076 | A | 6/1991 | Horsley et al. | 324/674 |
| 5,102,776 | A | 4/1992 | Hammer et al. | 430/311 |
| 5,126,638 | A | 6/1992 | Dethlefsen | 315/326 |
| 5,142,166 | A | 8/1992 | Birx | 307/419 |
| 5,313,481 | A | 5/1994 | Cook et al. | 372/37 |
| 5,377,044 | A | 12/1994 | Tomono et al. | 359/566 |
| 5,411,224 | A | 5/1995 | Dearman et al. | 244/53 |
| 5,448,580 | A | 9/1995 | Birx et al. | 372/38 |
| 5,504,795 | A | 4/1996 | McGeoch | 378/119 |
| 5,550,669 | A | 8/1996 | Patel | 359/224 |
| 5,729,562 | A | 3/1998 | Birx et al. | 372/38 |
| 5,763,930 | A | 6/1998 | Partlo | 250/504 |
| 5,801,891 | A * | 9/1998 | Lloyd | 359/871 |
| 5,866,871 | A | 2/1999 | Birx | 219/121 |
| 5,936,988 | A | 8/1999 | Partlo et al. | 372/38 |
| 5,963,616 | A | 10/1999 | Silfvast et al. | 378/122 |
| 6,031,241 | A | 2/2000 | Silfvast et al. | 250/504 |
| 6,039,850 | A | 3/2000 | Schulz | 204/192.15 |
| 6,051,841 | A | 4/2000 | Partlo | 250/504 |
| 6,064,072 | A | 5/2000 | Partlo et al. | 250/504 |
| 6,081,544 | A * | 6/2000 | Zamel et al. | 372/107 |
| 6,172,324 | B1 | 1/2001 | Birx | 219/121.57 |
| 6,195,272 | B1 | 2/2001 | Pascente | 363/21 |
| 6,360,035 | B1 * | 3/2002 | Hurst et al. | 385/18 |
| 6,452,199 | B1 | 9/2002 | Partlo et al. | 250/504 |
| 6,466,365 | B1 | 10/2002 | Maier et al. | |
| 6,496,528 | B2 * | 12/2002 | Titus et al. | 372/102 |
| 6,511,703 | B2 | 1/2003 | Pan et al. | 427/166 |
| 6,556,364 | B2 * | 4/2003 | Meehan et al. | 359/822 |
| 6,566,667 | B1 | 5/2003 | Partlo et al. | 250/504 |
| 6,566,668 | B2 | 5/2003 | Rauch et al. | 250/504 |
| 6,576,912 | B2 | 6/2003 | Visser et al. | 250/492.2 |
| 6,586,757 | B2 | 7/2003 | Melnychuk et al. | 250/504 |
| 6,614,829 | B1 * | 9/2003 | Tuganov et al. | 372/107 |
| 6,650,810 | B1 | 11/2003 | Lieberman et al. | 385/37 |
| 6,661,962 | B1 * | 12/2003 | Calvet et al. | 385/137 |
| 6,760,167 | B2 * | 7/2004 | Meehan et al. | 359/822 |
| 6,873,418 | B1 * | 3/2005 | Howey et al. | 356/451 |
| 6,912,052 | B2 * | 6/2005 | Rao et al. | 356/451 |
| 2001/0055364 | A1 | 12/2001 | Kandaka et al. | 378/119 |
| 2002/0100882 | A1 | 8/2002 | Partlo et al. | 250/504 |
| 2002/0163313 | A1 | 11/2002 | Ness et al. | 315/111.01 |
| 2002/0168049 | A1 | 11/2002 | Schriever et al. | 378/119 |
| 2003/0006383 | A1 | 1/2003 | Melynchuk et al. | 250/504 |
| 2003/0068012 | A1 | 4/2003 | Ahmad et al. | 378/119 |
| 2003/0219056 | A1 | 11/2003 | Yager et al. | 372/57 |

OTHER PUBLICATIONS

Bollanti, et al., "Compact Three Electrodes Excimer Laser IANUS for a POPA Optical System," *SPIE Proc.* (2206)144-153. (1994).

Bollanti, et al., "Ianus, the three-electrode excimer laser," *App. Phys. B (Lasers & Optics)* 66(4):401-406, (1998).

Choi, et al., "A $10^{13}$ A/s High Energy Density Micro Discharge Radiation Source," *B. Radiation Characteristics*, p. 287-290.

Choi, et al., "Fast pulsed hollow cathode capillary discharge device," *Rev. of Sci. Instrum.* 69(9):3118-3122 (1998).

Fomenkov, et al., "Characterization of a 13.5nm Source for EUV Lithography based on a Dense Plasma Focus and Lithium Emission," Sematech Intl. Workshop on EUV Lithography (Oct. 1999).

Hansson, et al., "Xenon liquid jet laser-plasma source for EUV lithography," Emerging Lithographic Technologies IV, Proc. Of SPIE . vol. 3997:729-732 (2000).

Kato, Yasuo, "Electrode Lifetimes in a Plasma Focus Soft X-Ray Source," *J. Appl. Phys.* (33) Pt. 1, No. 8:4742-4744 (1991).

Kato, et al., "Plasma focus x-ray source for lithography," *Am. Vac. Sci. Tech. B.*, 6(1): 195-198 (1988).

Lebert, et al., "Soft x-ray emission of laser-produced plasmas using a low-debris cryogenic nitrogen target," *J. App. Phys.*, 84(6):3419-3421 (1998).

Lebert, et al., "A gas discharge based radiation source for EUV-lithography," Intl. Conf. Micro and Nano-Engineering 98 (Sep. 22-24, 1998) Leuven. Belgium.

Lebert, et al., "Investigation of pinch plasmas with plasma parameters promising ASE," Inst. Phys. Conf. Ser No. 125: Section 9, pp. 411-415 (1992) Schiersee, Germany.

Lebert, et al., "Comparison of laser produced and gas discharge based EUV sources for different applications," Intl. Conf. Micro- and Nano-Engineering 98 (Sep. 22-24, 1998) Leuven, Belgium.

Lee, Ja H., "Production of dense plasmas in hypocyloidal pinch apparatus," *The Phys. Of Fluids*, 20(2):313-321 (1977).

Lewis, Ciaran L.S., "Status of Collision-Pumped X-ray Lasers," *Am Inst. Phys.* pp. 9-16 (1994).

Malmqvist, et al., "Liquid-jet target for laser-plasma soft x-ray generation," *Am. Inst. Phys.* 67(12):4150-4153 1996).

Mather, et al., "Stability of the Dense Plasma Focus," *Phys. Of Fluids*, 12(11):2343-2347 (1969).

Mayo, et al., "A magnetized coaxial source facility for the generation of energetic plasma flows," *Sci. Technol.* vol. 4:pp. 47-55 (1994).

Mayo, et al., "Initial Results on high enthalpy plasma generation in a magnetized coaxial source," *Fusion Tech* vol. 26:1221-1225 (1994).

Nilsen, et al., "Analysis of resonantly photopumped Na—Ne x-ray-laser scheme," *Am Phys. Soc.* 44(7):4591-4597 (1991).

Partlo, et al., "EUV (13.5nm) Light Generation Using a Dense Plasma Focus Device," *SPIE Proc. On Emerging Lithographic Technologies III*, vol. 3676, 846-858 (Mar. 1999).

Porter, et al., "Demonstration of Population Inversion by Resonant Photopumping in a Neon Gas Cell Irradiated by a Sodium Z Pinch," *Phys. Rev. Let.*, 68(6):796-799, (Feb. 1992).

Price, Robert H., "X-Ray Microscopy using Grazing Incidence Reflection Optics," *Am. Inst. Phys.*, pp. 189-199, (1981).

Qi, et al., "Fluorescence in Mg IX emission at 48.340 Å from Mg pinch plasmas photopumped by Al XI line radiation at 48.338 Å," *The Am. Phys. Soc.*, 47(3):2253-2263 (Mar. 1993).

Scheuer, et al., "A Magnetically-Nozzled, Quasi-Steady, Multimegawatt, Coaxial Plasma Thruster," *IEEE*: Transactions on Plasma Science. 22(6) (Dec. 1994).

Schriever, et al., "Laser-produced lithium plasma as a narrow-band extended ultraviolet radiation source for photoelectron spectroscopy." *App. Optics*. 37(7):1243-1248. (Mar. 1998).

Schriever, et al., "Narrowband laser produced extreme ultraviolet sources adapted to silicon/molybdenum multilayer optics," *J. of App. Phys.*. 83(9):4566-4571, (May 1998).

Silfvast, et al., "High-power plasma discharge source at 13.5 nm and 11.4 nm for EUV lithography," *SPIE*, vol. 3676:272-275, (Mar. 1999).

Silfvast, et al., "Lithium hydride capillary discharge creates x-ray plasma at 13.5 namometers," *Laser Focus World*, p. 13. (Mar. 1997).

Wilhein, et al., "A slit grating spectrograph for quantitative soft x-ray spectroscopy," Am. Inst. Of Phys. Rev. of Sci. Instrum.. 70(3):1694-1699, (Mar. 1999).

Wu, et al., "The vacuum Spark and Spherical Pinch X-ray/EUV Point Sources," *SPIE, Conf. On Emerging Tech. III*, Santa Clara, CA vol. 3676:410-420, (Mar. 1999).

Zombeck, M.V., "Astrophysical Observations with High Resolution X-ray Telescope," *Am. Inst. Of Phys.*, pp. 200-209, (1981).

* cited by examiner

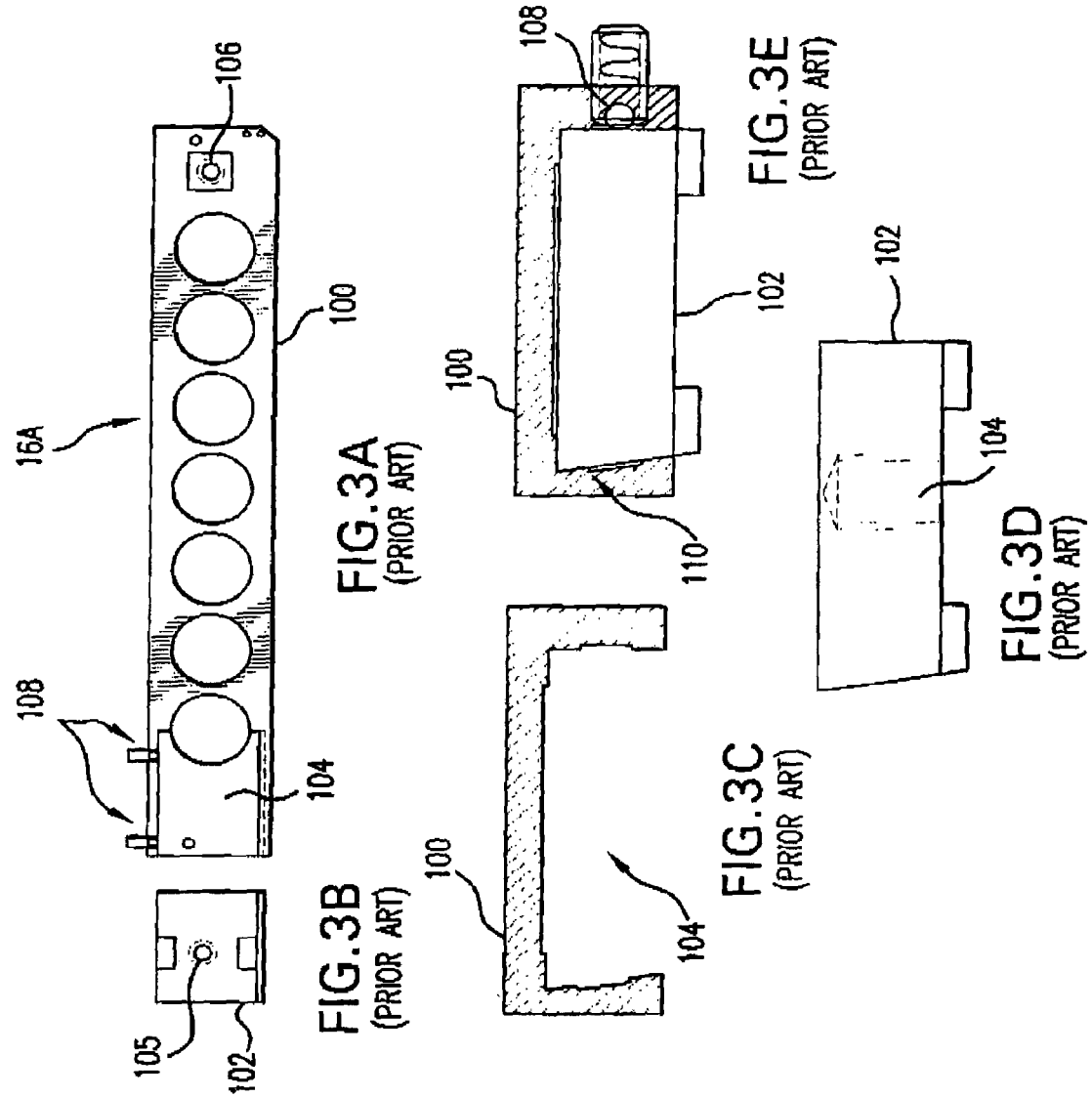

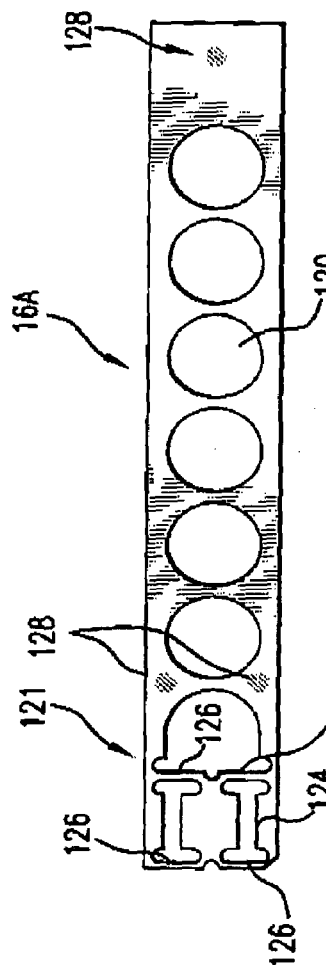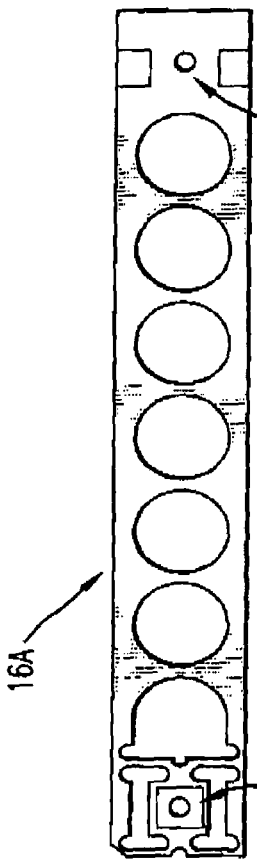
FIG. 4A (PRIOR ART)
FIG. 4B (PRIOR ART)
FIG. 4C (PRIOR ART)

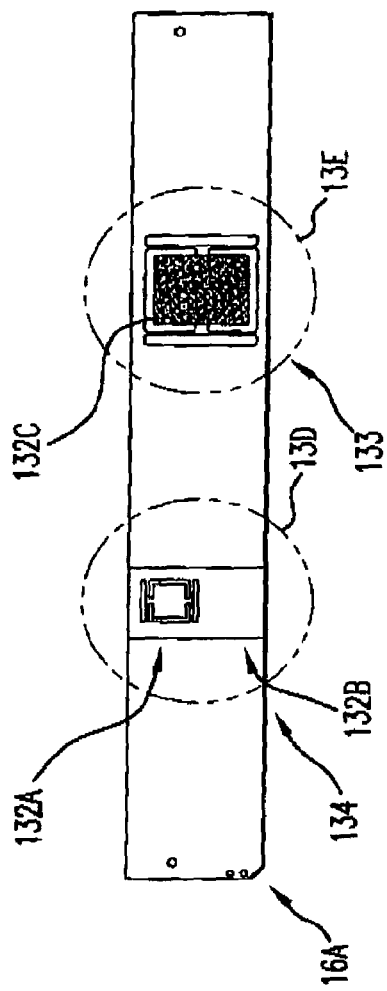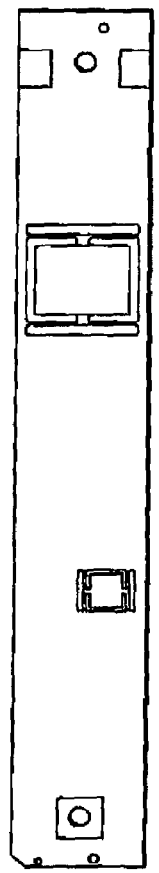
FIG. 5A (PRIOR ART)
FIG. 5B (PRIOR ART)
FIG. 5C (PRIOR ART)

DUV LIGHT SOURCE OPTICAL ELEMENT IMPROVEMENTS

RELATED APPLICATIONS

This application is a continuation-in-part of U.S. patent application Ser. No. 10/173,190, filed Jun. 14, 2002, now U.S. Pat. No. 6,750,972, which is a continuation-in-part of Ser. No. 10/141,201 filed May 7, 2002, now U.S. Pat. No. 6,839,372, Ser. No. 10/000,991 filed Nov. 14, 2001, now U.S. Pat. No. 6,795,474, Ser. No. 09/716,041, filed Nov. 17, 2000, now U.S. Pat. No. 6,778,584, Ser. No. 09/854,097, filed May 11, 2001 now U.S. Pat. No. 6,757,316, and is related to U.S. patent application Ser. No. 09/895,664, filed on Jun. 29, 2001, entitled LINE NARROWING UNIT WITH FLEXURAL GRATING MOUNT, published on Mar. 21, 2002, Publication No. 2002/0034208, and now issued as U.S. Pat. No. 6,496,528, issued to Titus et al. on Dec. 17, 2002 and U.S. patent application Ser. No. 10/608,521, filed on Jun. 26, 2003, with inventor Rafac, et al., entitled METHOD AND APPARATUS FOR STABILIZING OPTICAL DIELECTRIC COATINGS, the disclosures of which, to the extend not incorporated herein are incorporated herein by reference.

FIELD OF THE INVENTION

The present invention relates to line narrowing modules used in high power very high repetition rate narrow banded gas discharge lasers, e.g., excimer and molecular fluorine gas discharge lasers and particularly optical components relating to such modules.

BACKGROUND OF THE INVENTION

Gas discharge ultraviolet lasers used as light sources for integrated circuit lithography typically are line narrowed. A preferred prior art line narrowing technique is to use a grating based line-narrowing unit along with an output coupler to form the laser resonator cavity. The gain medium within this cavity is produced by electrical discharges into a circulating laser gas such as krypton, fluorine and neon (for a KrF laser); argon, fluorine and neon (for an ArF laser); or fluorine and helium and/or neon (for an $F_2$ laser).

Such a prior art system 1 is shown in FIG. 1, which is extracted from Japan Patent No. 2,696,285. The system 1 shown includes output coupler (or front mirror) 4, laser chamber 3, chamber windows 11, and a grating based line-narrowing unit 7. The line-narrowing unit 7 is typically provided on a lithography laser system 1 as an easily replaceable unit and is sometimes called a "line narrowing package" or "LNP" for short. This prior art unit includes two beam-expanding prisms 27 and 29 and a grating 16 disposed in a Littrow configuration. Gratings used in these systems 1 are extremely sensitive optical devices. A typical grating 16 surface may have 10,000 grooves per inch created in an aluminum layer or layers on a thick glass substrate. These gratings 16 and techniques for fabricating them are described in U.S. Pat. No. 5,999,318, which is incorporated herein by reference. A prior art technique for avoiding distortion of the grating 16 surface is to mount the grating 16 on a metal grating mount made of a material having a small co-efficient of thermal expansion closely matched to the thermal expansion co-efficient of the grating 16 glass substrate. The gratings 16 can deteriorate rapidly under ultraviolet radiation in the presence of oxygen in standard air. For this reason, the optical components of line narrowing units 7 for lithography lasers 1 are typically purged continuously during operation with nitrogen. For example as shown in the above referenced Japanese patent from which FIG. 1 is taken, a nitrogen purge system 40 may include, e.g., a nitrogen bottle 44 containing nitrogen under pressure may, when valve 48 is opened provide nitrogen through a nitrogen purge line 45 under flow control from, e.g., a flow control mechanism 46 into the interior of the enclosure surrounding the line narrowing package 7. As shown in this Japanese patent, the nitrogen gas 45 is injected behind the grating 16 and purposely not flowed across the reflecting facets of the grating 16.

FIG. 2 shows a prior art line-narrowing unit 50 fabricated by applicants' employer, Cymer, Inc., as a part of a prior art line narrowed lithography KrF laser system incorporating such a device. The unit 50 includes, e.g., three beam expanding prisms 58, 60 and 62, a tuning mirror 64 and a grating 16. Note that the nitrogen purge from bottle 44 enters the unit on the back side of the tuning mirror 46 to avoid purge flow directly on the grating 16 face, as shown in the above referenced Japanese patent. In this system 20 the wavelength of the laser beam 6 can be controlled, e.g., in a feedback arrangement in which the wavelength of the beam 6 is measured by a beam wavelength monitor 22 and a computer controller 24 uses the wavelength information to adjust the angular position of the tuning mirror 64 to control the wavelength to a desired value. A wavefront (and thus also bandwidth) control device 70 can be used, e.g., to mechanically bend the grating 16 to make it slightly concave, for example, or slightly convex. This device 70 is described in detail in U.S. Pat. No. 5,095,492 assigned to Cymer. Use of this device 70 can permit, e.g., reduction of the bandwidth somewhat, but it can still go out of specification when the laser is run at high duty cycle.

For many years, designers for line narrowed lasers have believed that distortions of the laser beam could be caused by gas flow near the face of the grating 16. Therefore, laser designers in the past have made special efforts to keep the purge nitrogen from flowing directly on the face of the grating 16. Several examples of these efforts are described in the Japan Patent 2,696,285 referred to above. In the example shown in extracted FIG. 1, the purge flow is directed from $N_2$ gas bottle 44 toward the backside of grating 16 through purge line 45.

Line narrowed ultraviolet laser light sources currently in use in the integrated circuit industry typically produce about 10 mJ per pulse at repetition rates of about 4000 Hz and duty factors (duty cycles) of about 20 percent. Increased integrated circuit production can be achieved at higher repetition rates and greater duty cycles. Applicants' employer is currently selling a 4000 Hz gas discharge lithography laser, including some, e.g., in a MOPA configuration. Higher repetition rates along with higher duty cycle demands and requirements of ever narrower bandwidths, can, even in MOPA configurations, place sever constraints on optical components, e.g., the LNP 50 to be able to maintain consistent narrow bandwidths. A significant portion of the problem arises from the requirements to maintain rather strict parameter controls on the laser beams traveling through the system, e.g., including wavefront control, which can impact the performance of the LNP among other optical and lasing components of the system 2.

A need exists for more reliable line narrowing packages 50 and other optical elements of the laser system 2 to accommodate such requirements as high repetition rate, high duty cycle, bandwidth stability, included not exceeding some specific bandwidth and/or not allowing the bandwidth to go below some lower limit in addition to not exceeding some upper limit, exposure dose stability, and the like for gas discharge lasers of the type disclosed in the present application.

It has also been known to mount the mirror 64 on a mirror mount as shown in FIGS. 6 and 6A using a plurality of, e.g., three, mounting balls, e.g., made of aluminum, including, e.g., two right (as shown in the figure) mounting balls 156 and one left (as shown in the figure) mounting ball 158. The mounting balls 156, 158 may, e.g., be contained in cylindrical pockets, e.g., as shown more clearly in FIG. 9 at 156a and 156b showing a version of an aspect of an embodiment of the present invention, which are formed in the mirror mount 152. The mounting balls 156, 158 may cooperate with spring loaded mounting clips 168 contained respectively on a right (as shown in the figure) elevation wall 162 of the mirror mount 152 and on a left (as shown in the figure) mounting wall 164 of the mirror mount to hold the mirror 154 in place firmly, but without distorting the face of the mirror or its flatness, as will be understood by those skilled in the art. Problems have arisen, however, with such mountings, e.g., induced by thermal stressing of the mirror mount 152 and the mirror 154, which, due to the fact that the former of which is usually made of metal, e.g., aluminum, invar or stainless steel, and the latter of glass, e.g., fused silica, having very different coefficients of thermal expansion will expand differently when heated.

It has been found that the prior art mounting just described can cause several problems most notably in negatively impacting the LNP 50 in performing its functions within the very stringent requirements for, e.g., wavelength and bandwidth accuracy and stability. What has been discovered to be occurring is that differing thermal expansion of the mirror 154 and the mount 154 tends to force the mirror to slide across the mounting ball surfaces, as was the original design intent. However, the glass surface of the mirror 154 has been found to intermittently and unpredictably sometimes adhere to the mounting ball surfaces or at least one of them causing intermittent and unpredictable distortions in the face of the mirror 154 with concomitant disastrous results in the maintenance of wavelength and/or bandwidth stability. An aspect of an embodiment of the present invention is for the purpose of resolving this problem and related species of problems that similarly impact the contribution of the mirror 64 in the LNP in the performance of its functions.

It has also been noted that as optical elements, e.g., the grating 16 is the LNP 50 are being subjected to higher fluence environments grating 16 failures have increasingly been observed. The observation is also that these failures, by in large, are a result of oxidation of the aluminum reflective layer that forms the reflecting surface of the grating. An aspect of an embodiment of the present invention is directed to a solution to this increasingly more significant problem.

A prior art line narrowed gas discharge laser, e.g., a KrF excimer laser or an ArF excimer laser, operating at relatively low average power, typically less than 5 W, will produce a laser beam centered, respectively at about 248 nm or 193 nm with a bandwidth of less than 0.6 pm. Such lasers can run without problems at repetition rates, up to 2000 Hz and even above that as long as average power is below 5 W. More modern lasers with, e.g., a MOPA configuration can operate at repetition rates exceeding 4000 and with even higher power. However, this, combined with duty cycle requirements, and in some cases customers have been known to operate such laser lithography light sources at near 100% duty cycle over long stretches of time, days or weeks. A typical lithography gas discharge laser has a pulse energy of 10 mJ. By way of example, such lasers can be run at 2 kHz in bursts of 200 pulses with pause between bursts of about, e.g., 0.4-0.45 seconds. Such an operation will produce an average power of:

$$P_{ave} = \frac{10 \text{ mJ} \cdot 200 \text{ pulses}}{0.5 \text{ sec}} = 4 \text{ W} \quad (1)$$

When the interburst delay is decreased, e.g., with the laser running the same 200 pulse bursts with a 0.1 second interburst delay will have an average power of:

$$P_{ave} = \frac{10 \text{ mJ} \cdot 200 \text{ pulses}}{0.2 \text{ sec}} = 10 \text{ W} \quad (2)$$

At maximum, the laser is run in continuous mode which, at 2000 Hz and 10 mJ pulse energy, is equivalent to 20 W average power. These factors simply go up with increases in repetition rates, e.g., to and above 4000, increasing such things as the thermal loading in optical components, including particularly the line narrowing package. The increases on thermal loading only serve to make the problems of maintaining precision operation of such elements as the reflecting mirror 64 and the grating 16 more difficult at the very time when the requirements for precision in operations are becoming even more stringent.

FIG. 2A-1 is a side view showing a prior art method of mounting a grating 16 to the floor of the LNP 50 enclosure. In this case, the thick glass substrate of the grating is attached to mounting plate 16A at each of three spots with very short epoxy dots 17A-C. FIG. 2A-2 shows the approximate dot positions at 17A, 17B and 17C. The mounting plate 16A is screwed securely to the floor of the LNP enclosure with two screws 16B and 16C. In this prior art design, the mounting plate 16A is made of invar, which has a co-efficient of thermal expansion close to zero and to that of the grating 16 glass substrate which may be, e.g., ultra low expansion glass and also close to zero in coefficient of thermal expansion. However, the LNP 50 enclosure is aluminum, which has a co-efficient of thermal expansion substantially different from both invar and the grating 16 glass substrate. As a consequence, temperature excursions in the LNP 50 produces bending stresses on the mounting plate 16A which is screwed tightly to the bottom of the LNP 50 enclosure and the plate 16A in turn produces bending stresses on the grating 16 through the short epoxy dots. As long as the temperature excursions are small the dots are flexible enough to prevent significant distortion; however, at high repetition rates in the range of 2000 Hz to 4000 Hz and above and high duty factors, thermal distortion in the grating 16 has been so great as to substantially adversely affect the quality of the laser beam both in terms of bandwidth and wavelength centerline stability, and the problem is only getting worse.

As noted in the above referenced U.S. Pat. No. 6,496,528, the cause of beam quality deterioration with increasing beam energy, the cause was not initially readily apparent, however, applicants recognized that differential thermal expansion was causing an undesirable bending of the grating 16 which was causing, e.g., the deterioration in beam quality. As a result, applicants designed several modifications in the LNP to solve this problem as discussed in the above referenced U.S. Pat. No. 6,496,528.

One such improvement known in the art is shown in FIGS. 3A, B and C, which are top, side and bottom views respectively of a grating mount 16A" with a single H-Flex joint 121. This mount 16a" is comprised of invar which, as stated above has a very small thermal coefficient of expansion about the same as the, e.g., Ultra-Low-Expansion ("ULE") made by Corning, or e.g., fused silia grating 16 glass substrate. The mount 16A" is about ½ inch thick and has a length approximately equal to the thick glass substrate of the grating 16 to be mounted on it. Holes 120 are cut into the mount 16A" primarily to reduce its weight. An H-Flex joint 121 is machined into the mount 16A" as shown in FIG. 4A. Two dog-bone shaped holes 124 are cut into the mount 16A" producing an "H" shape flex joint 121 so as to leave four flex legs 126 each about 0.060 inch thick. The grating 16 is preferably mounted to the mount 16A" with three short epoxy dots at locations 128 about 4 mils high and 1 cm in diameter as shown in FIG. 4A.

The mount 16A" is screwed securely to the bottom of the LNP 50 enclosure using threaded holes 130 shown in FIG. 4C. The H-Flex joint 121 permits thermal expansion and contraction of the LNP 50 enclosure bottom without transmittal of any significant stress to the grating 16. The joint 121 provides very little resistance to small forces in the long direction of the grating 16. The expansion co-efficient is about 0.001 inch per pound, in this long direction, but is extremely strong and resistant to forces in any other direction.

A third embodiment according to the prior art can be described by reference to FIGS. 5A, B, C, D, E and F. FIG. 5A is a top view, FIG. 5B is a side view and FIG. 5C is a bottom view. This mount 16A''' is similar to the one described above and shown in FIG. 4A. However, this mount 16A''' has two H-Flex joints 134 and 133 as shown enlarged in FIGS. 5D and 5E respectively. The mount 16A''' is made of aluminum as is the LNP 50 enclosure. The mount 16A''' is mounted to the enclosure as described in the previous embodiment. The grating 16 is attached to the mount 16A''' with three short epoxy pillars as described above at the positions 132A, 132B and 132C as shown in FIGS. 5A, 5D and 5E. The surface of the mount 16A''' at the epoxy positions (in this as well as the other embodiments) is preferably abraded with #40 grit dry blast alumina to produce a good epoxy surface. The legs of H-Flex joint 134 and H-Flex joint 133 are about 0.030 inch wide. H-Flex joint 133 permits expansion of the mount 16A''' relative to the grating 16 in the long direction of the grating and H-Flex joint 134 permits expansion in a short direction of the grating 16 as indicated by the drawings. The second H-Flex joint 134 permits the use of aluminum as the mount 16A''' material, which is less expensive and easier to machine than invar. Preferably, a four-mill shim (not shown) is used in this and the other embodiments when attaching the grating 16 to the mount to assure that the epoxy dots are the correct thickness (i.e., height).

Preferred designs of grating mounts 16A-16A''' of the prior art take into consideration the material used for the mount. For example, in the FIGS. 3A-D and in FIGS. 4A-C examples, invar is used for the mounts 16A' and 16A" which has a thermal co-efficient of thermal expansion similar to the thick ULE glass grating 16 substrate. Therefore, the grating 16 is attached with the three short epoxy dots at two far apart locations to the long part 100 of the mount 16A' with no attachment to the short part 102 of the mount 16A'. In this example, one end of the long portion 100 of the mount 16A' is attached to the LNP 50 enclosure and the short portion 102 of the mount 16A' at the other end of the mount 16A' is separately attached to the LNP 50 enclosure. The H-flexure joints in the second example 16A" permits the mount 16 and the LNP 50 enclosure (having significantly different coefficients of thermal expansion) to expand and contract at different rates.

In the FIG. 5A-E examples, the mount 16A''' is securely attached at two locations to the enclosure housing. This produces no significant stresses since both the mount 16A''' and the enclosure housing are aluminum. The grating 16 substrate which has a coefficient of expansion substantially different from aluminum is attached to each of the three separate parts of the mount 16A''' which by reason of the two H-flexure joints 133, 134 are free to move relative to each other. Thus, if in the FIGS. 3A-D and FIGS. 4A-C examples the mount were made of aluminum then in each case the long part of the mount only should be attached to the chamber floor and the grating should be attached to both parts. Also if in FIGS. 5A-E example, invar were used for the mount, the grating should be attached to the long solid part and the mount should be attached to the chamber at points 132A, 132B and 132C.

Turning now to FIG. 6 there is shown a prior art mounting for a maximum reflecting mirror according to the prior art as discussed above. The maximum reflecting mirror, referred to as RMax 150 corresponds, e.g., to the mirror 64 in FIG. 2. In the past, as noted above, this mirror 150 comprised of an almost totally reflecting, i.e., RMax, multiple layer mirror, has been mounted onto a mirror mount 152. In efforts to meet the problems created in the prior art design, applicants tried a variety of alternative materials and combinations of materials for the mounting balls 156, 158, with varying degrees of partial but incomplete success.

Applicants have proposed in the past to carry out active control of the wavefront of a laser produced from a gas discharge, e.g., excimer or molecular fluorine, laser using, e.g., a bending screw and a stepper motor. In the past, this solution may have been too expensive for the amount of benefit to the laser performance being within required specifications. However, as noted above, the requirements are becoming exceptionally more demanding and wavefront, particularly in its impact on line narrowing, e.g., in an eschelle grating type line narrowing unit as described above, is becoming more critical to control. Currently in many lasers in the field, a grating bending screw is set at a compromise position empirically determined between a hot and cold position of the grating and then left alone, so-called set and forget. However, this solution if becoming increasingly less satisfactory and the requirements being placed on the laser systems, particularly, e.g., due to lithography light source requirements, a stepper motor active control may not even be satisfactory. An aspect of an embodiment of the present invention seeks to resolve these issues.

Applicants have also discovered that even with a flexure mounting, the forces exerted on the optical element in simply moving the flexure element can be sufficient to introduce discernable and unacceptable effects on such things as beam profile, wavelength, bandwidth or the like. Therefore another aspect of an embodiment of the present invention is meant to correct this problem.

It is also known to protect laser optics, particularly containing metal halide crystal glass, e.g., $MgF_2$, using a silicon oxyfluoride coating, e.g., fluorine doped fused, i.e., amorphous, silica, as discussed e.g., in U.S. Pat. No. 6,466,365, entitled FILM COATED OPTICAL LITHOGRAPHY ELEMENTS AND METHOD OF MAKING, issued to Maier et al. on Oct. 15, 2002, for purposes of, e.g., providing a protective coating that is adequately transmissive in the VUV range of wavelengths. Such coatings serve, e.g., to prevent the introduction of impurities into the crystal structure voids from the surrounding ambient atmosphere, with resultant damaging effects to the optical performance of the optical element. Similarly, applicant assignee has used such coatings to prevent DUV damage to transmissive optical elements, as discussed, e.g., in United States Published Patent Application No. 2003/0219056 A1, entitled HIGH POWER DEEP ULTRAVIOLET LASER WITH LONG LIFE OPTICS, with inventors Yager et al., published on Nov. 27, 2003, based on an application Ser. No. 10/384,967, filed on Mar. 8, 2003. The coating serves to provide fluorine atoms to replace fluorine atoms removed from, or perhaps displaced in the crystal structure of the fluoride glass due to high fluence of DUV radiation through the glass, e.g., in laser chamber window, thereby preventing fluence related optical damage to the glass of the optical element. Applicants herein propose yet another utilization for such protective coatings in relation to laser optical systems.

It has been known for some time that line narrowing module gratings are subject to failures, which have been identified as relating to oxidation of the metallic reflective coating, e.g., aluminum on the grating surface. Currently coatings on metallic reflecting surfaces exposed to DUV light, e.g., at 193 nm consist of fluoride coating materials, e.g., $MgF_2$, due to the resistance of such materials to damage in the DUV range of fluence and high transmissivity, i.e., transparency, of such coatings. However, such coatings have not been successful in protecting gratings exposed to high fluence of DUV light. An aspect of an embodiment of the present invention addresses this problem.

It is well known that organic materials, e.g., certain polymers, cannot be used in portions of laser systems according to those employing various embodiments of the present invention. Not only do they typically not react well to UV light, but also are highly chemically reactive to laser gases, e.g., fluorine or chlorine. However, in certain applications in such laser systems in the optical path, but sealed from exposure to the reactive gases, organic materials, e.g., Teflon, may be necessary for use due to the large differences in price between such seals and the, e.g., metal c-ring seals used in contact with the reactive laser gases. An aspect of an embodiment of the present invention deals with the solution of certain problems arising from using such organic materials in seals in the optical path, e.g., external to the laser chamber.

SUMMARY OF THE INVENTION

A high power narrow band, high repetition rate laser light source optical improvement apparatus and methods are disclosed which may comprise a fast moving angularly positionable tuning mirror comprising: a mirror mounting frame comprising a first material and a relatively flat mounting surface area; a reflective optic comprising a second material having a coefficient of thermal expansion different from that of the first material of the mounting frame; at least two attachment points of attachment between the mounting frame and the reflective optic on the mounting frame surface; and, at least one flexure mount formed in the mounting frame that is flexible in a flexure axis corresponding to a longitudinal axis of thermal expansion of the mounting frame and the reflective optic, positioned at one of the at least two points of attachment. The flexure mount may comprise: a flexure body formed from the material of the mirror mounting frame and separated from the material of the mirror mounting frame to allow relative movement between the flexure and the mirror mounting frame; at least one flexure arm formed from the material of the mirror mounting frame and attached at one end to the mirror mounting frame and at the other end to the flexure. The apparatus and method may further comprise a flexure force mechanism made of the second material or a third material having a coefficient of thermal expansion that is essentially the same as that of the second material; the flexure force mechanism comprising an elongated rod; a flexure force mechanism slot generally aligned with the flexure axis and sized to snuggly fit the flexure force mechanism between a slot wall at one end of the flexure force mechanism slot and the flexure body at the other end of the flexure force mechanism slot. The force mechanism may pre-stress the flexure. The mirror may be a grating. The grating may have a metallic reflective surface and a protective coating over the reflective coating comprising a dense glassy material that is essentially non-porous to undesired contaminants exposure of which to the reflective coating is desired to be prevented, which may comprise an amorphous silica, a doped amorphous silica, which may be halide doped and the halide may be fluorine. The grating may be actively tuned using an electro- or magneto-sensitive element. Oxides of the metal in the reflective layer may be removed by a hydrogen purge. Exposed optical sealing members sensitive to DUV light may be shielded by an annular protection shield placed on the optic.

BRIEF DESCRIPTION OF THE DRAWINGS

FIGS. 2A-1 and 2A-2 show a prior art grating mounting technique;

FIGS. 3A, B, C, D and E show prior art grating mountings;

FIGS. 4A, B and C show prior art grating mountings;

DETAILED DESCRIPTION OF PREFERRED EMBODIMENTS

Figure 7:
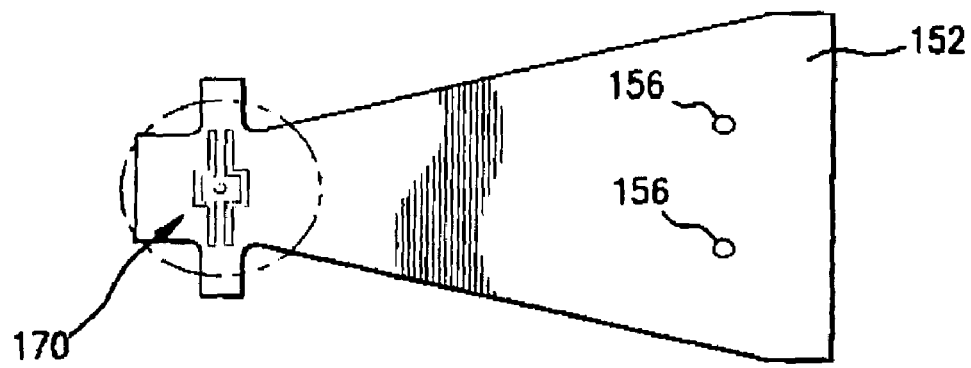
FIG. 7 shows schematically an aspect of an embodiment of the present invention relating to an RMax mounting.
Figure 8:
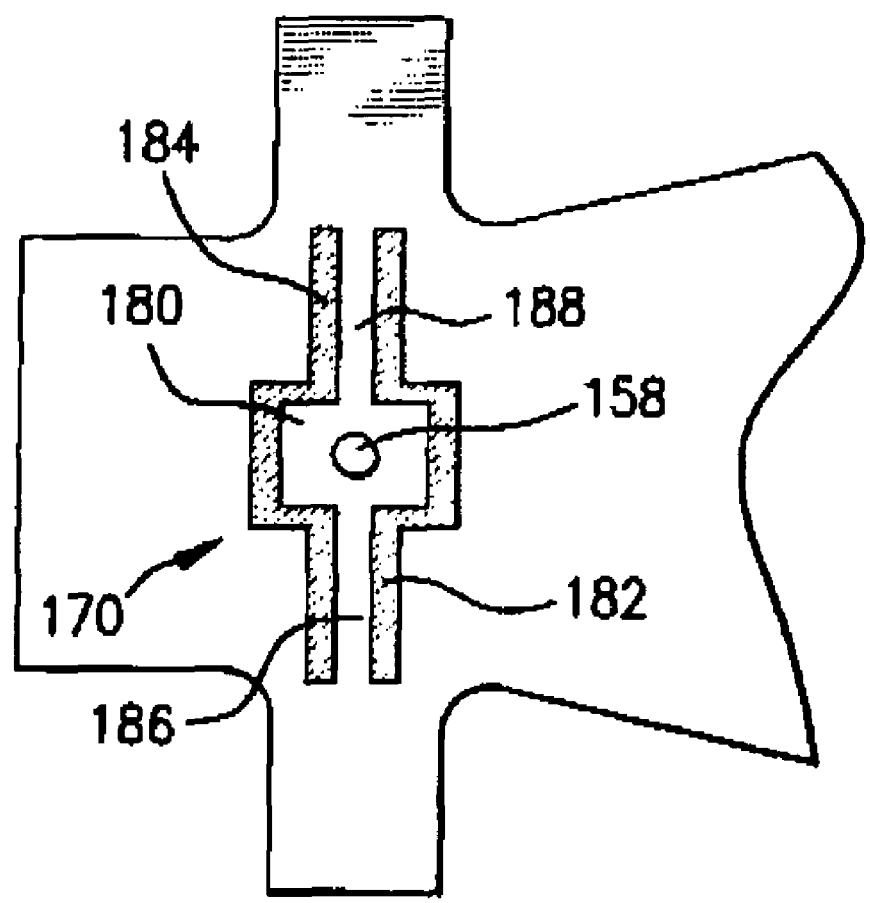
FIG. 8 shows in more detail an enlarged plan view of an aspect of an embodiment of the present shown schematically in FIG. 7.
Figure 9A:
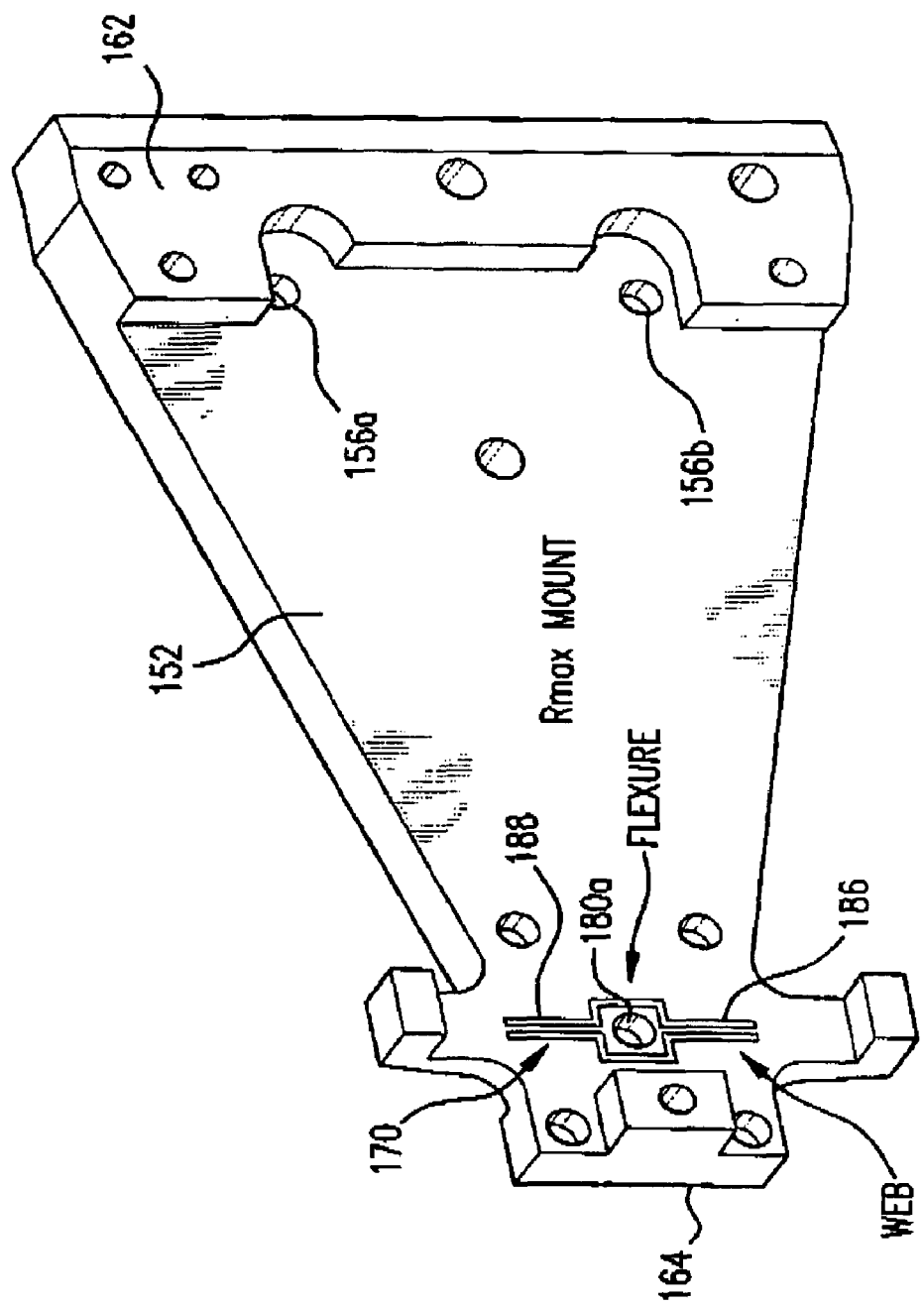
FIG. 9A shows a perspective view of an aspect of an embodiment of the present invention shown more schematically in FIG. 7.
Figure 9B:
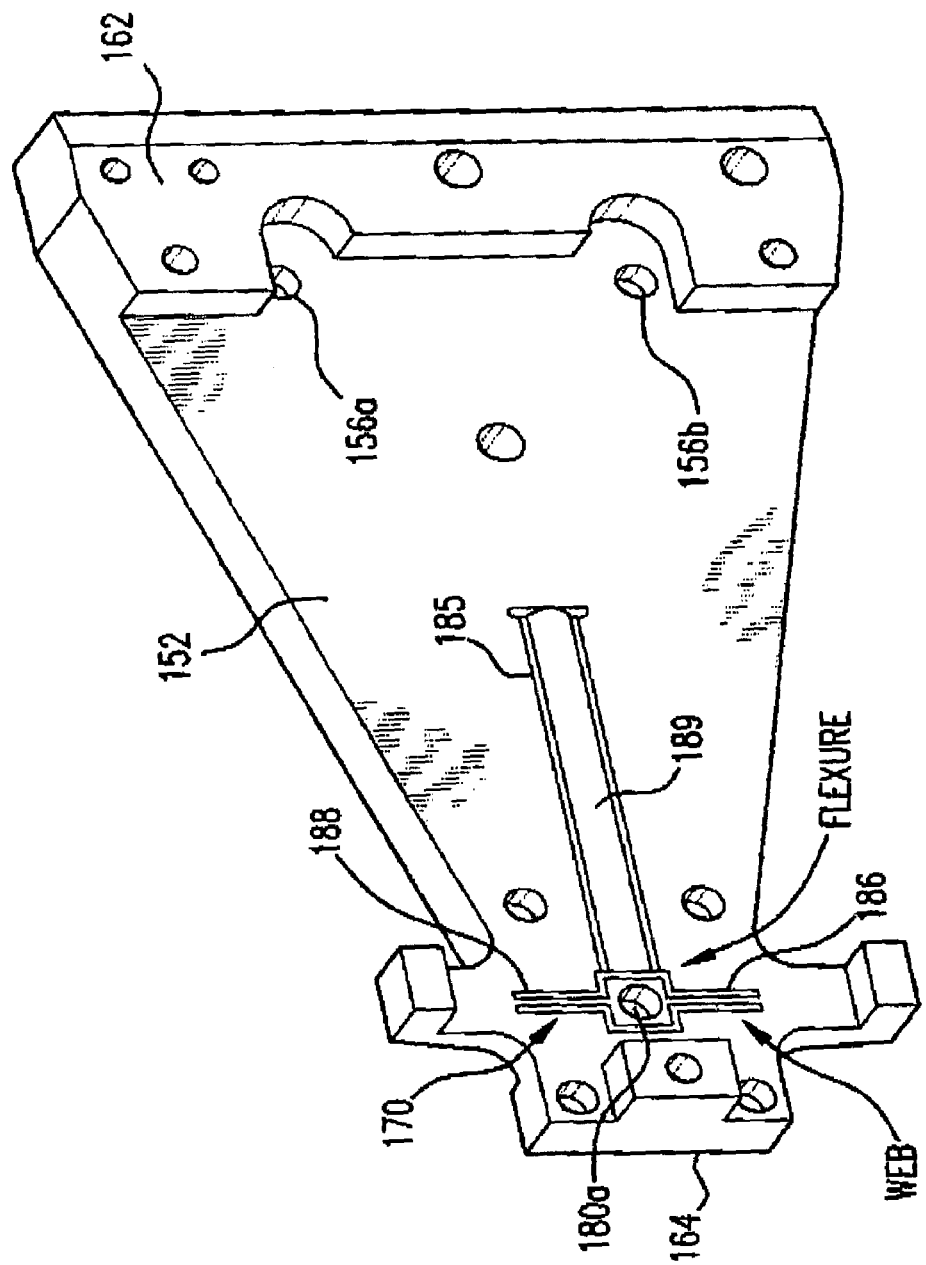
FIG. 9B shows an alternative embodiment of a flexure mounting according to an aspect of an embodiment of the present invention.

According to an embodiment of the present invention shown partly schematically in FIGS. 7-9, problems with wavefront, wavelength and bandwidth selection and wavelength and bandwidth stability, among other things, have been resolved. Turning now to FIG. 7 there is shown schematically a mirror mount 152 containing mounting balls 156 and also a mounting ball 158 on a flexure mount assembly 170 that enables translation of the mounting ball along the principal axis of thermal expansion as the mirror 154 and mount 154 differentially thermally expand. Shown in more detail in FIG. 8 the flexure mount assembly 170 can comprise, e.g., a flexure mount 180 which can contain a cylindrical opening 180a, shown in FIG. 9, which is flexibly attached to the mount 152 by a pair of upper (as shown in the figure) and lower (as shown in the figure) flexure arms 186 and 188. The flexure arms 186 and 188 and the flexure mount 180 itself are separated from the rest of the mount 152 by slots 182 and 184 through the material of the mount 152.

Thus formed, the flexure mount 180 can easily translate under force induced by any sticking action between the mirror 154 and the mounting ball 158 in the cylindrical opening 180a. Thus the mirror 154 is still optically firmly and snugly held in place by the spring clip 164 (not shown in FIGS. 7-9) while being allowed to expand at the same time as any sticking action occurs between the mirror and any of the mounting balls 156, 158. Distortion of the mirror face and the concomitant very severe undesirable effects are effectively eliminated according to this aspect of an embodiment of the present invention.

Turning now to FIG. 9a there is shown an aspect of an embodiment of the present invention showing a flexure force bar 185, similar to that described below in regard to FIGS. 11-13. The force bar 185 is contained in a force bar slot 189 and abuts at one end the mounting 152 and at the other end the flexure 180a.

Figure 10:
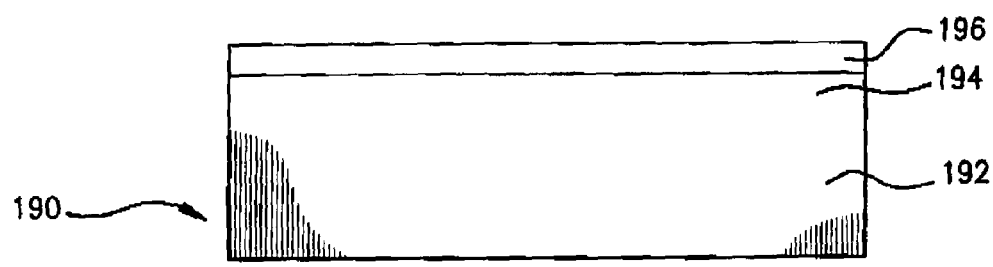
FIG. 10 shows schematically a mechanism and method for protecting grating reflective coatings according to an aspect of an embodiment of the present invention.

Turning now to FIG. 10 there is shown schematically a grating 190, which may comprise a substrate, which may comprise, e.g., a glass substrate 192, e.g., an ultra-low expansion ("ULE") glass e.g., as supplied by Corning, or, e.g., BK7 Schott glass supplied, e.g., by Valley Supply Corp of Westford Mass., which may be covered, e.g., with a thin film coating 194, e.g., of a sufficiently reflective while optically durable coating, e.g., of a metal, e.g., of aluminum. The reflective coating 194 may then be covered with a protective coating 196, which also may be a thin film coating of, e.g., a very low porosity, e.g., glassy, material, which is sufficiently transparent to, e.g., ultraviolet light. Applicants have found that at least one such material that is suitable is, e.g., a doped fused silica glass, e.g., a fluorine doped fused silica glass, e.g., as supplied by Corning Inc. (e.g., a silicon oxyfluoride). Applicants have shown that, particularly at 193 nm, such a material for a coating layer is highly resistant to UV damage from extended and/or high fluence exposure to UV light. Advantages of the combination include the ability to use relatively low cost thin metal reflecting coatings as the reflecting surface, while extensively reducing the oxidation and like damage to such reflective coatings, particularly under DUV light fluence, than is the case with less effective prior art protective coating layers. For example, existing coatings of, e.g., magnesium fluoride or other fluoride coating materials, which have high resistance to UV damage, are not acceptable long life coatings for reflective metallic layers, because over time they allow migration of oxidizing contaminants into the metallic layer or perhaps even contain oxidizing contaminants resulting from their manufacture, which also leech down into the reflective layer supposedly being protected. Fused silica with only a doping of fluorine has the advantage of being less so porous, because it is a much more glassy and non-porous material and, therefore, very suitable to prevent migration of undesirable contaminants, e.g., oxidants, through the coating to damage the underlying thin metal reflective coating. Applicants have found that the presence of a halide, e.g., fluorine in the, e.g., silicon oxyfluoride also make the performance better than the prior art in, e.g., reducing the formation of oxides of the metal, e.g., $Al_2O_3$, especially under DUV light fluence. It will be understood by those skilled in the art that other forms of amorphous relatively dense glassy materials may be used that have the required relatively high transparency for DUV, e.g., other forms of amorphous silicon (silica), and including, e.g., fused silica doped with other materials, e.g., other halides than fluorine.

Figure 11:
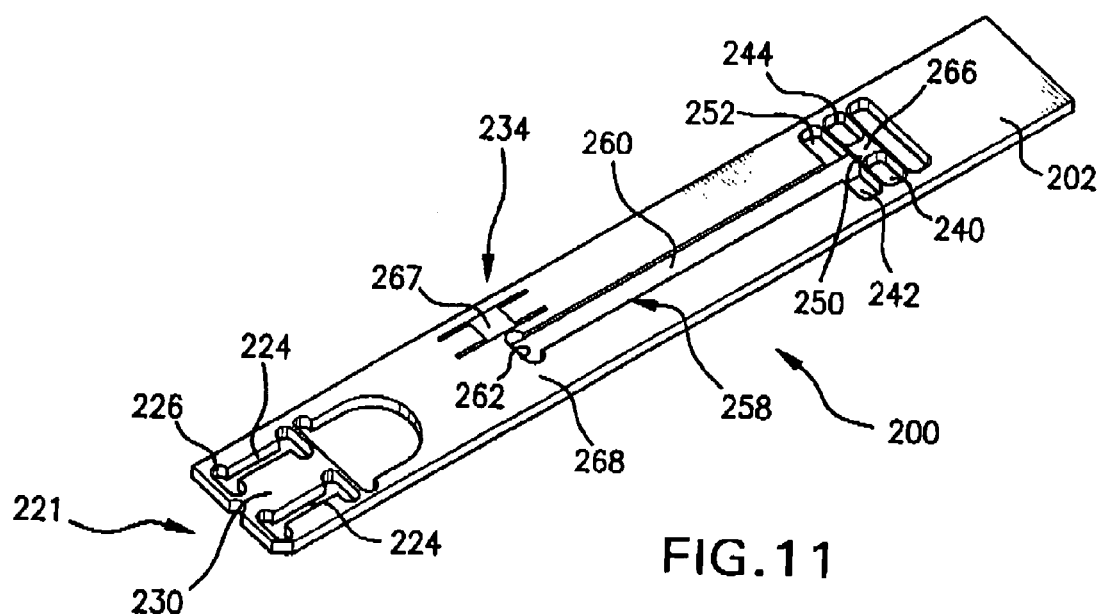
FIG. 11 shows an isometric perspective view of a grating mount according to an aspect of an embodiment of the present invention, looking from the side to which the grating will be attached.
Figure 12:
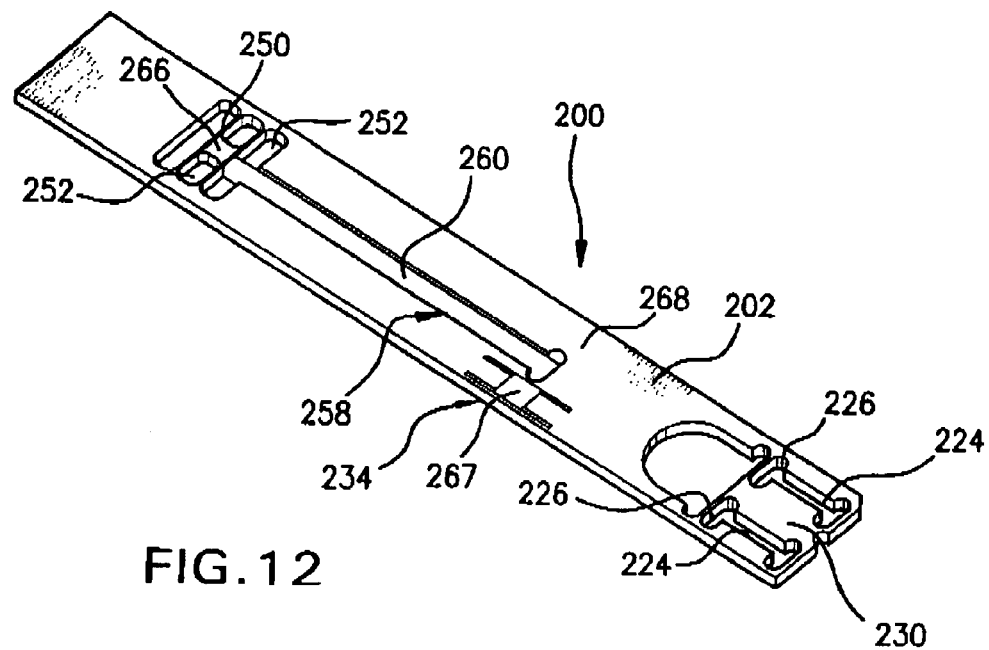
FIG. 12 shows an isometric perspective view of the grating mount of FIG. 11 generally along the longitudinal axis of the mounting.
Figure 13:
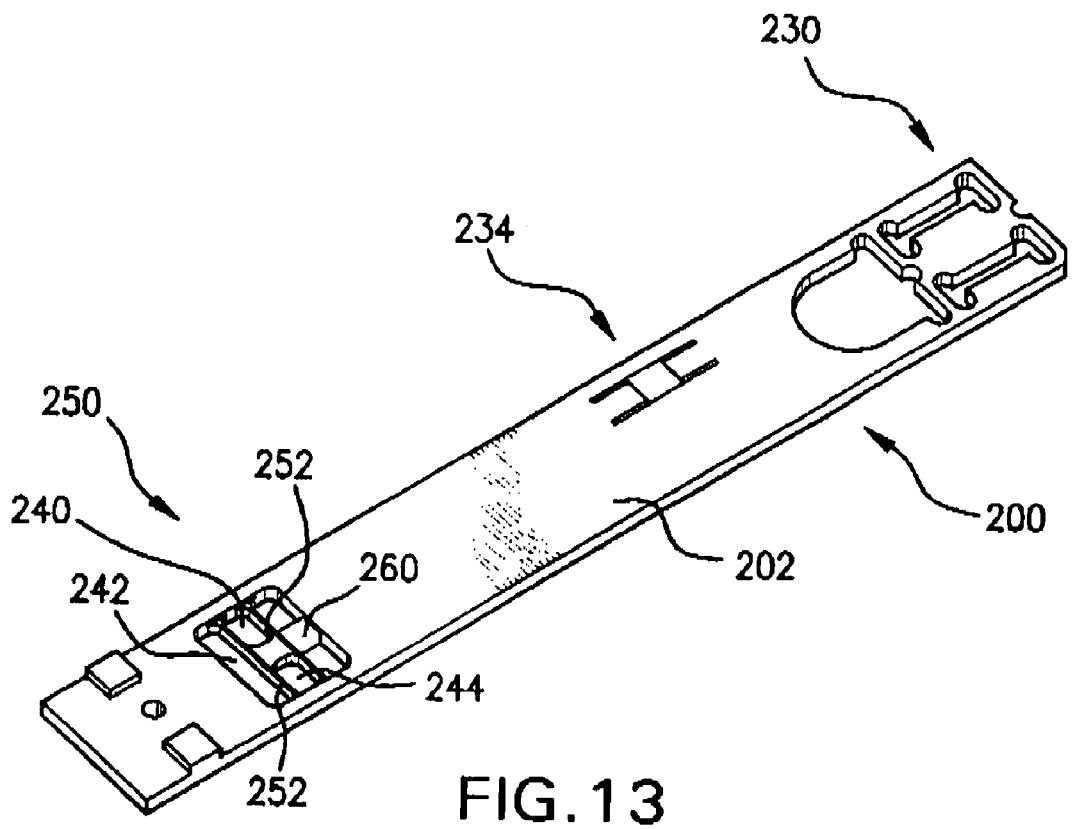
FIG. 13 shows an isometric perspective view of the grating mount of FIGS. 11 and 12 looking from the opposite side of the mounting from where the grating will be attached.

Turning now to FIGS. 11-13 there is shown an improved grating mounting 200 according to an embodiment of the present invention. The grating mounting 200 may comprise, e.g., an elongated generally rectangular body 202 including, e.g., a flexure mounting 221 formed in the body 202. The flexure mounting 221 may be formed by cutting from the mounting body 202 a pair of dog-boned shaped slots 224 on either side of a flexure 230, with, e.g., the respective opposite ends of the dog-bone shaped slots forming with one end of the body 202 and with an opening 225 in the mounting body 202 four flexure arms, respectively 224 and 226. The dog-boned shaped slots are so called due to the shape left after the flexure arms 224 and 226 are formed and those skilled in the art will appreciate that they need not be dog-boned shaped, per se. The flexure mount 221 is for mounting the grating mounting body 202 to, e.g., to the floor of the enclosure of a line-narrowing module 50. This flexure mount is designed to account for differential thermal expansion between the mount 200 and the enclosure of the line-narrowing module 50 in the longitudinal axis of the body 202.

In addition the grating mount 200 may also comprise a longitudinal flexure mount 240 and a lateral flexure mount 234 for attaching the grating to the mount body 202, as described above. The longitudinal flexure mount 250 may be formed of a flexure 250 and arms 252 formed by cutting lateral slots 242 and lateral openings 244 in the body to form the flexure 250 and arms 252, as is known in the art. Similarly the lateral flexure 234 may be formed as is known in the art. As is also known in the art, the grating may be attached to the flexure 250 and the flexure 234 to account for differential thermal expansion of the mount body 202 with respect to the grating (not shown in FIGS. 11-13). Attachment may be, e.g., with an adhesive, e.g., an epoxy at attachment points 266, 267 and 268, with the attachment points 266 and 267, respectively, on the flexure 250 and the flexure 234.

Applicants have discovered that along with the beneficial results of the flexure mounting of the grating (not shown) to the grating mounting body 202 as just described certain problems manifest themselves with this arrangement as requirements being placed on the laser systems using such line narrowing units, e.g., for lithography uses, e.g., regarding does stability and control, bandwidth stability and control and wavelength stability and control, operate to place ever continuing requirements for such thins as tighter and tighter wavefront control, e.g., within the line narrowing module. Applicants have examined, e.g., wavefront instabilities, e.g., over time and with duty cycle changes influencing the fluence seen by the grating and the differential thermal expansion of the grating and the mounting and have determined that even the flexure mounting discussed above is insufficient to account for beam fluctuation due to the thermal loading on the grating and the grating mount.

Applicants have also determined that the cause is due to the fact that even the forces exerted on the grating by the action of the flexure mountings, particularly the longitudinal axis flexure mounting 250 in flexing are enough to cause sufficient distortion in the grating reflecting slots, longitudinally and laterally, to be seen in a failure of the laser output light to meat or remain within specifications. According to an aspect of an embodiment of the present invention, applicants have proposed a solution to this problem, as shown in FIGS. 11-13.

As can be seen from FIGS. 11-13, the grating mounting body may be provided with, e.g., a force rod slot 258 into which may be snuggly fit a force rod 260, such that the force rod 260 at one end abuts a force rod detaining wall 262 and at the other end abuts the flexure 250 at a force rod engagement side 264 of the flexure 250. The force rod 260 may be made, e.g., of an ultra low expansion ("ULE") glass, which is the same material as the bulk of the grating itself, and thus will expand exactly the same amount or essentially exactly the same amount as the grating itself as temperature changes. In operation, therefore, the differential expansion of the grating mount 200 and the grating (not shown) attached to the grating mount 200 at attachment points 266, 267 and 268 will cause the grating mount 200 to try to expand the distance between mounting points 266 on the one hand and both 267 and 268 on the other hand on the grating mount 200 more than the respective points on the grating expand in the longitudinal axis of the grating mount 200. Similarly there will be differential expansion between mounting points 267 and 268 generally orthogonally to the longitudinal axis but of a lesser degree and which is handled by flexure mount 234. In regard to the longitudinal axis, however, the flexure mount 250 still exerts a force on the grating in absorbing the differential longitudinal axis expansion between the grating mount 200 and the grating (not shown). Therefore, the flexure mount 250 will tend to move toward the center of the longitudinal axis of the grating mount 200 and the force rod 260, expanding at the same rate as the grating itself, will prevent that motion and thereby absorb the force from the flexure mount 250 attempting to flex. The flexure 250 and flexure arms 252 may be, e.g., also be pre-stressed with the force rod 260 in a direction towards the near end of the grating mount 200, such that the stress that would otherwise be translated to the grating due to differential expansion under thermal stress will be further absorbed in the pre-stressed arms 252 of the flexure 250, along with in the force rod 260.

Figure 12A:
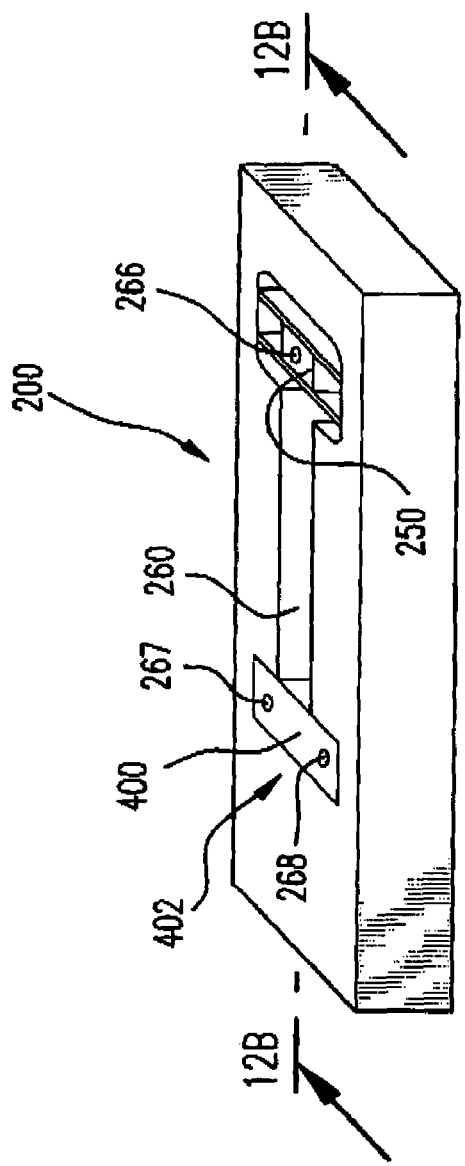
FIGS. 12A and 12B show an alternative embodiment of the grating mount of FIG. 12 according to aspects of an embodiment of the present invention, with FIG. 12B being a cross-sectional view along the lined 12B-12B in FIG. 12A.
Figure 12B:
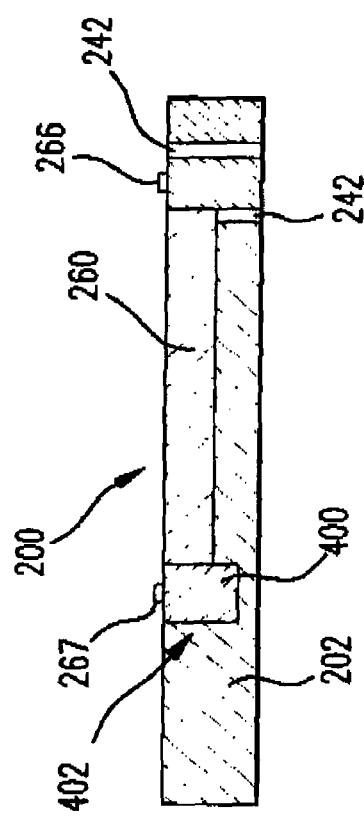

Turning now to FIGS. 12A and 12B there is shown another alternative embodiment of a grating mount 200 according to aspects of an embodiment of the present invention. In the embodiment of FIGS. 12A and 12B an additional glass expander 400 is added and placed in an expander slot 402. The expander 400 may be made, w.f., of the same ULE glass as the rod 260 and may abut the rod 260 on one side and the body 202 of the grating mount 200 on the other side, in the longitudinal direction of the grating mount. The expander 400 may be snugly fit into the slot 402, such that the expander as it expands in the lateral direction of the grating mount 200, the aluminum grating mount will expand slightly more, giving the expander 400 room to expand in the lateral direction of the grating mount 200. The expander 400 may have on it the mounting points 267, 268 for the grating (not shown) such that the expander 400 can take the place of the flexure mount 34 in the embodiment of FIG. 12.

Figure 14:
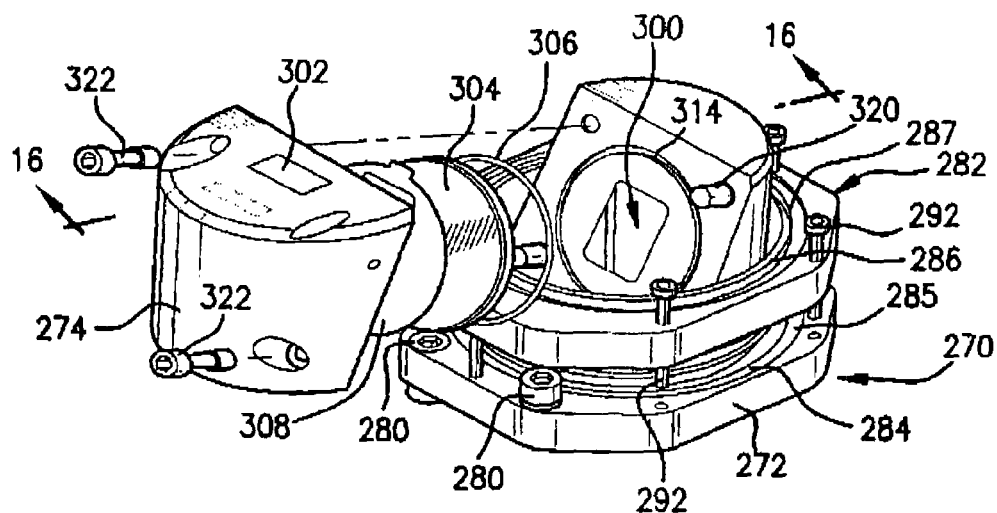
FIG. 14 shows a perspective partially exploded view of an external optical assembly according to aspects of an embodiment of the present invention.
Figure 16:
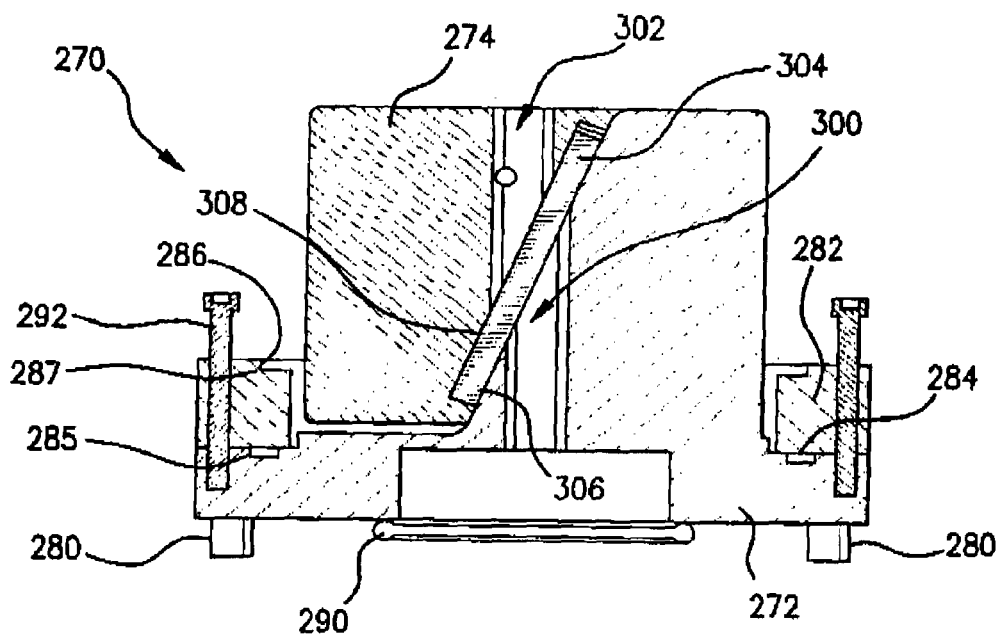
FIG. 16 shows a cross-sectional view of the external optical assembly shown in FIGS. 14 and 15 along the lines 16-16 in FIG. 13.
Figure 15:
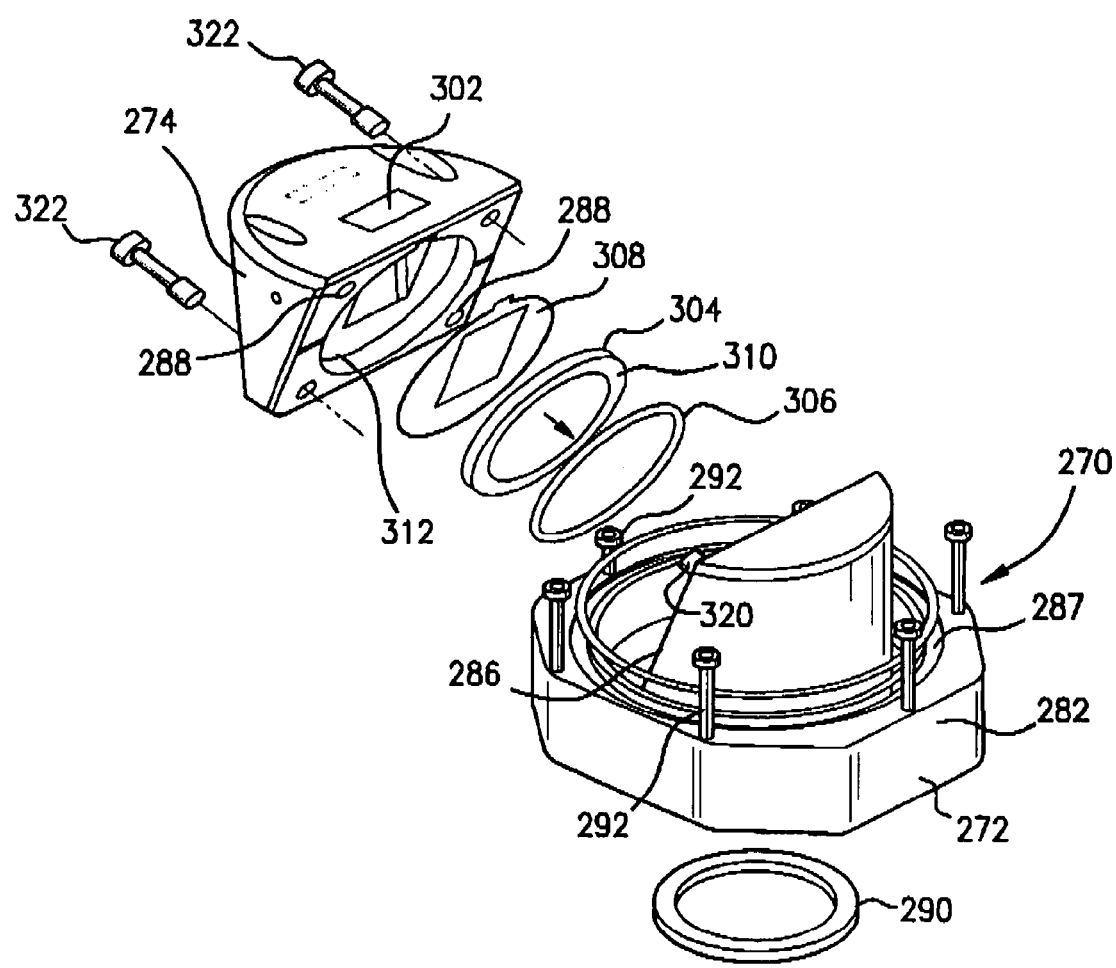
FIG. 15 shows another perspective partially exploded view of the external optical assembly according to aspects of an embodiment of the present invention.

Turning now to FIGS. 14-16 there is shown a laser system optical window mounting 270 according to an embodiment of the present invention. The window mounting 270 may include, e.g., an inner window mount 272, which may be attached to the wall of a laser chamber (now shown) by mounting bolts 280 and sealed using, e.g., a foil coated metal sealing ring 290.

The window mount 270 may also include, e.g., an inner sealing ring 282, which may be attached to the inner window mount 272 by a plurality of sealing ring attachment screws 292 and also have a foil coated metal c-ring seal 284 within a sealing groove 285 to form a seal between the inner window mount 272 and the inner sealing ring 282. The inner sealing ring 282 may also have a foil covered metal seal ring 286 contained in a sealing ring groove 287 to provide a seal between the inner sealing ring 282 and an outer sealing ring (not shown) also held in place by the sealing ring attachment screws 292.

The inner window mount may be formed with in internal beam passage 300 through which the output laser beam produced in the laser chamber (not shown) exits the chamber. Also included may be, e.g., an outer window mounting 274 having an internal beam passage 302 and a window receiving recess 312. The outer window mount may include, e.g., mounting screws 322 to attach the outer window mounting 274 to the inner window mounting 272 with alignment pegs 287 inserted into corresponding alignment openings 288 in the outer window mounting.

The recess 312 is sized and shaped to contain therein when the inner window mount 272 is attached to the outer window mount 274 a window optic 304, an o-ring seal 306 and a support foil 308, e.g., made of relatively compliant tin to support the window optic 304 without putting undue stress on the window optic 304. The window 304 is held in place by the inner window mount 272 and the outer window mount 274 at an angle to the beam passage 300 so as to insure almost complete transmissivity of the beam through the window 304. The passage 302 is offset laterally to the optical path of the laser beam from the passage 300 to account for the refractive offset of the beam passing through the window.

Due to the angled nature of the window mounting 272 and the geometries involved some areas of the o-ring seal 306 may be exposed to UV light fluence. This can be very damaging to such o-ring, typically made from organic materials, e.g., polymers or elastomers, e.g., Teflon and can be decomposed from this exposure. This can cause seal failure over time or in a worst case introduce elastomer debris into the laser gas environment inside the chamber with potentially very serious performance degradation issues. While the o-ring seal 306 is not directly exposed to DUV, back scattering and reflection from within the window mount 272 assembly, e.g., from the surfaces of the window 304 itself, has been found to be damaging the o-ring seals 306.

In order to solve this problem, applicants have placed a protective shielding coating 310, e.g., on the annulus of the window 304. This coating of, e.g., a thin film of aluminum deposited on the annulus of the window will shield the o-ring from the UV fluence. It will be understood that the protective shield coating need not be entirely annular in shape or even extend around the entire window circumference, but need only protect the o-ring seal 306 from the, e.g., back-scattered DUV light.

Figure 1:
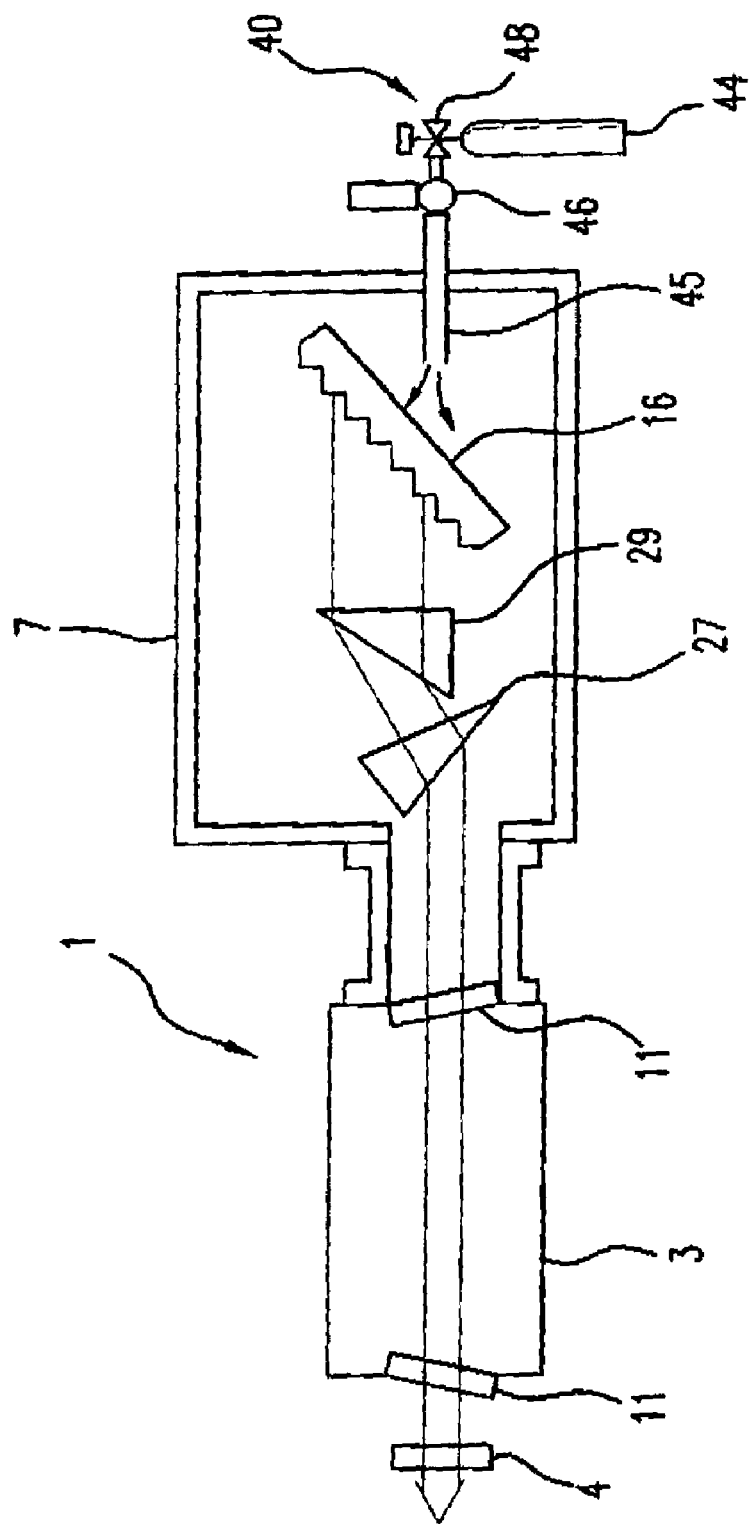
FIG. 1 shows a first prior art line narrowed laser system.
Figure 2:
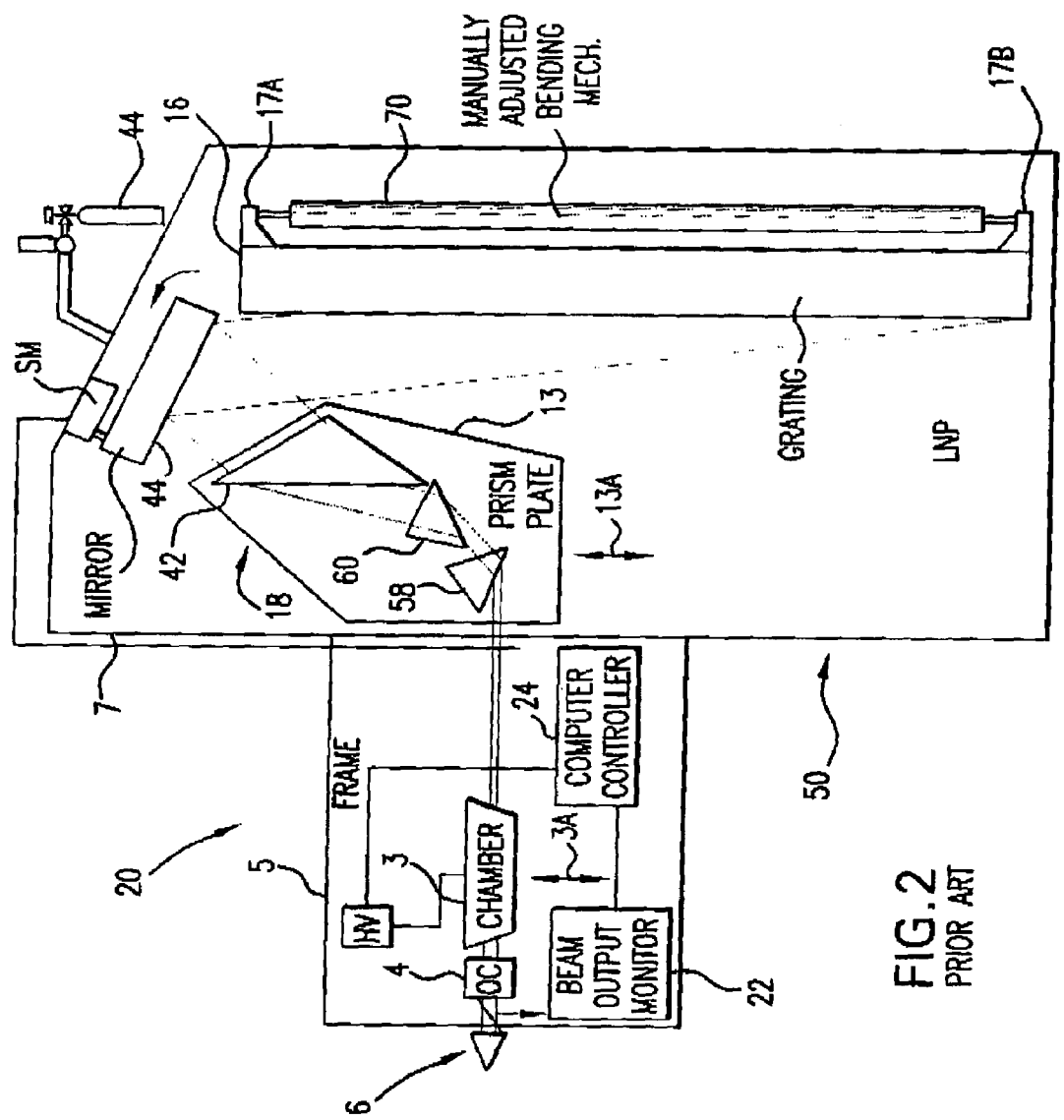
FIG. 2 shows a second prior art line narrowed laser system.
Figures 1, 2A:
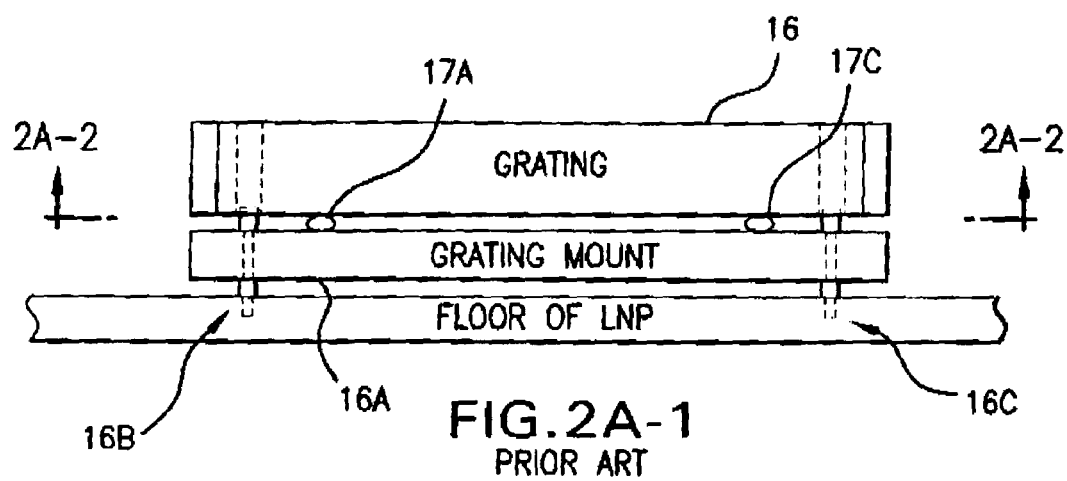
Figures 2, 2A:
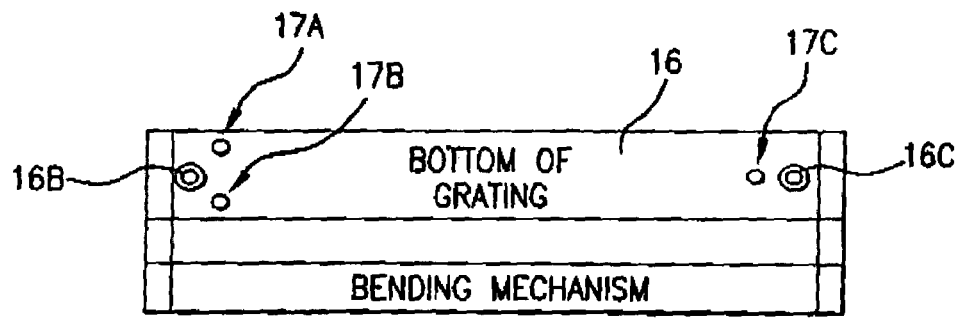
Figure 5D:
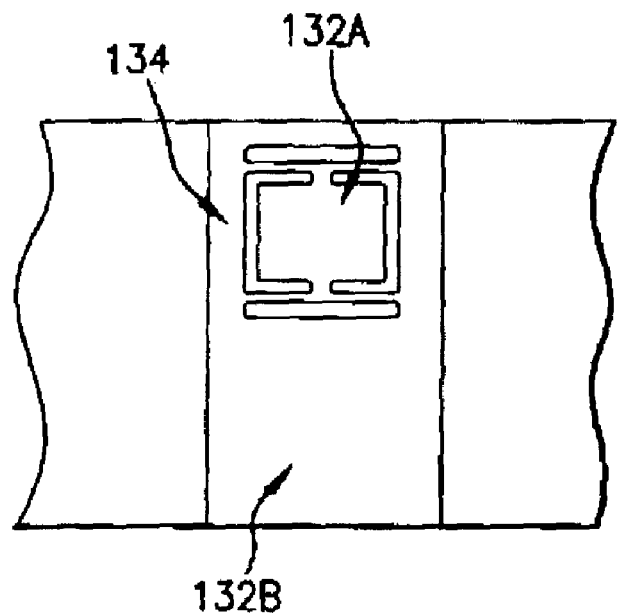
FIGS. 5A, B, C, D, and E show prior art grating mountings.
Figure 5E:
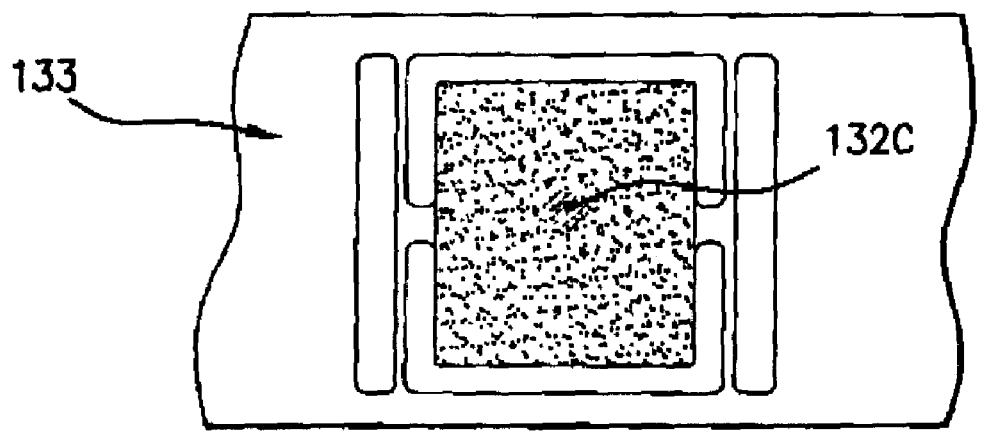
Figure 6A:
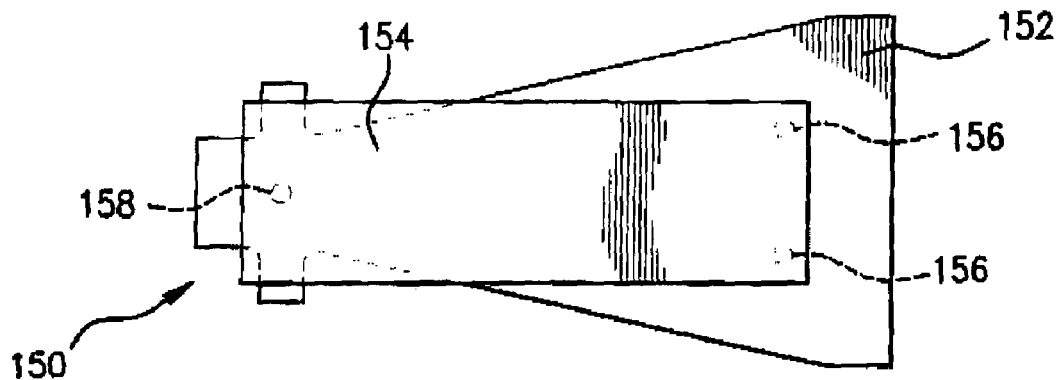
FIGS. 6A and B show schematically aspects of a prior art mounting for a maximum reflecting mirror RMax according to the prior art.
Figure 6B:
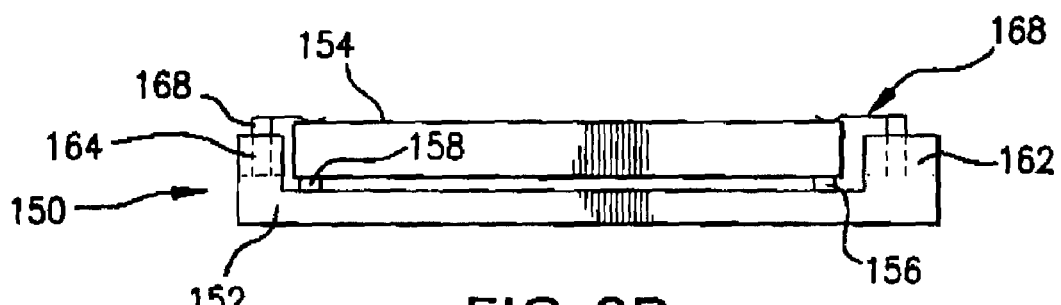
Figure 17:
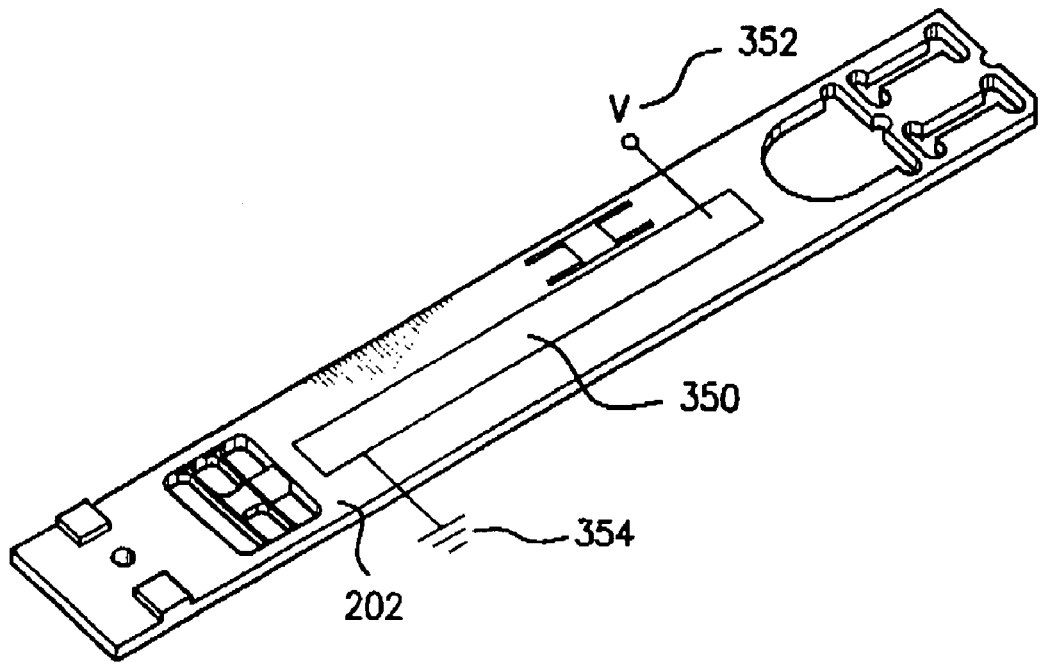
FIG. 17 shows schematically an aspect of an embodiment of the present invention.

Turning now to FIG. 17, three is shown an arrangement for beam control for a laser of the type discussed in the present application. In the past beam control using, e.g., the grating, e.g., to control wavefront of the beam, has been proposed to be done with a stepper motor attached, e.g., to a large screw and/or screw and spring arrangement adapted to bend the entire grating optic or the grating mounting and optic simultaneously as shown for example in FIG. 2A-2 and also in U.S. Pat. No. 6,496,528 referenced above. FIG. 17 illustrates schematically the placement of an active grating mount bending mechanism 350, e.g., a piezoelectric or other electro- and/or magneto-sensitive element, e.g., that bends or otherwise distorts itself under the influence, e.g., of an electric or magnetic field. The element 350 may have a voltage source for DC or AC voltage, which in the later case may be modulated in some desirable fashion, and a ground of common voltage connection 354. When, e.g., in the case of a DC actuated element, e.g., a piezoelectric sheet 350 there is applied a voltage to the voltage supply terminal 352, the piezoelectric element will, e.g., deform, e.g., by some controlled amount to, e.g., actively change the curvature of the grating (not shown in FIG. 17, and/or the grating mount 202.

Figure 18:
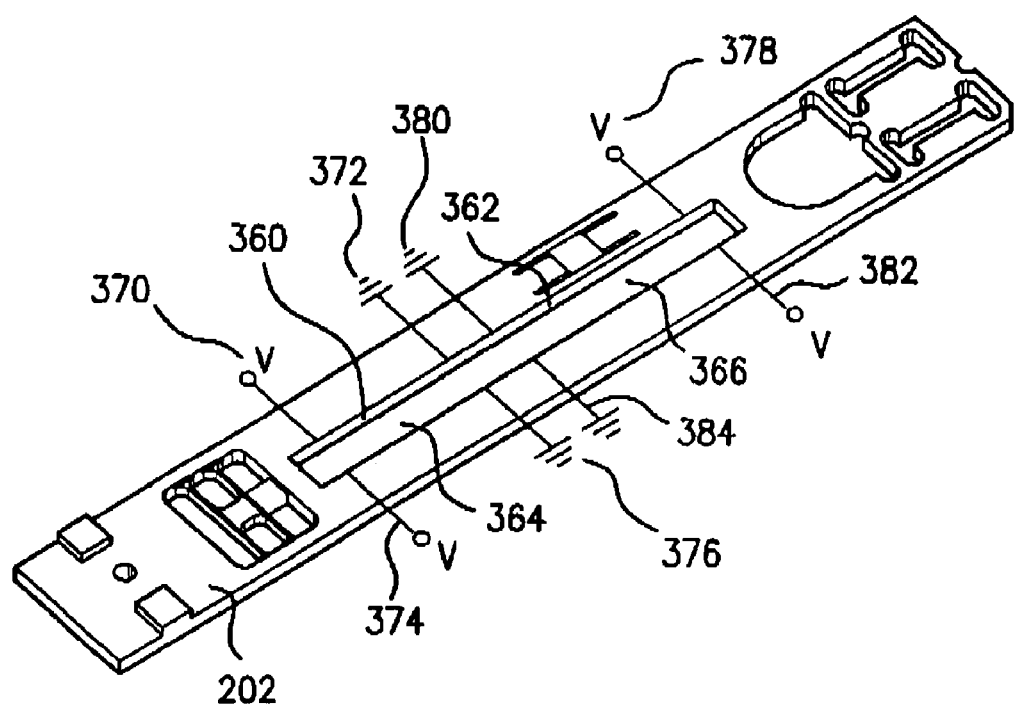
FIG. 18 shows schematically an aspect of an embodiment of the present invention.

Turning now to FIG. 18, there is shown another embodiment of an active grating controller for a grating mount 202, which may, e.g., incorporate several electro- or magneto-sensitive elements 360, 362, 364 and 366, each with a respective stimulating mechanism, e.g., respectively, voltage supplies 370, 374, 378 and 382, and ground connections, respectively 372, 376, 380 and 382. As shown schematically in FIG. 18, this plurality of, e.g., electro-sensitive elements 360, 362, 364 and 366 may be variously arranged to, when selectively actuated, bend and twist the grating and/or the grating mount 202 to which the grating is attached. It will be understood that the grid of elements, e.g., 360, 362, 364 and 366 illustratively shown by example in FIG. 19 could comprise a larger array and connected to stimulators in a variety of polarities to control the bending or twisting of the grating and/or the grating mount as may be required and as understood by those skilled in the art of, e.g., piezoelectric actuators.

Figure 19:
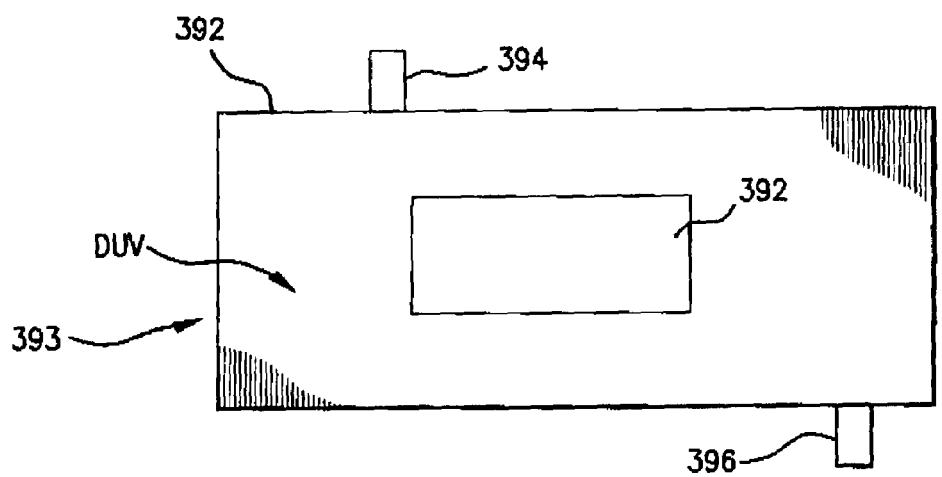
FIG. 19 shows schematically another aspect of an embodiment of the present invention.

Turning now to FIG. 19, there is shown another aspect of an embodiment of the present invention, which may comprise an enclosure 393 containing, e.g., a DUV optical element, e.g., a grating 392. The optical element, e.g., grating 392 may be exposed to a source of DUV light through an opening 393 in the enclosure 392. The enclosure may have a purge inlet opening 394 and a purge outlet opening 396. The interior of the enclosure 392 may be purged through the purge inlet opening 396 by a purge gas, e.g., containing hydrogen ($H_2$), e.g., mixed with a more inert gas, e.g., helium, argon, neon, xenon, and the like, with helium being preferred according to an aspect of an embodiment of the present invention.

Applicants have found that damage to optical elements containing, e.g., reflective metallic surfaces, e.g., the grating in a line narrowing module of, e.g., a narrow band DUV light source, is, in part, induced by DUV excited photoemission of electrons from, e.g., the metallic coating, e.g., aluminum, e.g., where $\phi=4.08$ eV and $h\nu=5$ eV, which can, e.g., cause photo-assisted oxidation of the metallic reflective coating, even under a protective coating. It is quite easy for oxygen present in the environment to take an electron from the aluminum forming, e.g., $Al_2O_3$. Without incident DUV photons oxidation proceeds at a more normal slower rate, given the protective coating, or even without a protective coating.

Applicants have found that a purge of, e.g., hydrogen, e.g., mixed in a more inert gas, e.g., in about a 5% by weight percentage will tend to remove the $O_2$ from the oxidized surface of the optical element, e.g., a reflective grating 392. This purge will also tend to scavenge residual $O_2$ within the enclosure, whether there due, e.g., to diffusion into or outgasing into the gas content of the enclosure, which may be a vacuum or may be, e.g., nitrogen. The reactions occurring may be, e.g., $H=H=O \rightarrow H_2O+h\nu$ and $H+H+O+h\nu=H_2O$. The $H_2O$ may then be conveniently removed through the purge gas outlet 396.

It will be understood that the enclosure 392 may be a sealed optical enclosure, e.g., part of a line narrowing module, containing, e.g., a grating 392 irradiated by DUV during actual laser operation or may be a vessel used to reclaim optical elements, e.g., gratings 392 by exposure to hydrogen and DUV apart from a line narrowing module enclosure or apart from the line narrowing module being irradiated during laser operation, i.e., of the entire line narrowing module is removed for optical element reclamation at a site remote from the laser on which the grating was irradiated during laser use.

Many other changes and modifications may be made to the presently disclosed embodiments and aspects of embodiments of the present invention, without departing from the concept and scope of the inventions. The appended claims, therefore, should not be considered to be limited to particular preferred embodiments and the claims should be interpreted to cover those disclosed embodiments and equivalents.

We claim:

1. A high power narrow band, high repetition rate laser light source system comprising:
    a line narrowing unit having a fast moving angularly positionable tuning mirror comprising:
        a mirror mounting frame comprising a first material and a relatively flat mounting surface area;
        a reflective optic comprising a second material having a coefficient of thermal expansion different from that of the first material of the mounting frame;
        at least two attachment points of attachment between the mounting frame and the reflective optic on the mounting frame surface; and, at least one flexure mount formed in the mounting frame that is flexible in a flexure axis corresponding to a longitudinal axis of thermal expansion of the mounting frame and the reflective optic, positioned at one of the at least two points of attachment.

2. The system of claim 1, further comprising:
the flexure mount comprises:
   a flexure body formed from the material of the mirror mounting frame;
   at least one flexure arm formed from the material of the mirror mounting frame and attached at one end to the mirror mounting frame and at the other end to the flexure body; and
   a plurality of slots in the mirror frame configured to allow relative movement between the flexure body and the mirror mounting frame.

3. The system of claim 2 further comprising:
the at least one flexure arm comprises a first and a second flexure arm oppositely positioned on either side of the flexure body generally orthogonal to the flexure axis.

4. The apparatus of claim 1 further comprising:
a flexure force mechanism made of the second material or a third material having a coefficient of thermal expansion that is essentially the same as that of the second material;
the flexure force mechanism comprising an elongated rod;
a flexure force mechanism slot generally aligned with the flexure axis and sized to snuggly fit the flexure force mechanism between a slot wall at one end of the flexure force mechanism slot and the flexure body at the other end of the flexure force mechanism slot.

5. The system of claim 2 further comprising:
a flexure force mechanism made of the second material or a third material having a coefficient of thermal expansion that is essentially the same as that of the second material;
the flexure force mechanism comprising an elongated rod;
a flexure force mechanism slot generally aligned with the flexure axis and sized to snuggly fit the flexure force mechanism between a slot wall at one end of the flexure force mechanism slot and the flexure body at the other end of the flexure force mechanism slot.

6. The system of claim 3 further comprising:
a flexure force mechanism made of the second material or a third material having a coefficient of thermal expansion that is essentially the same as that of the second material;
the flexure force mechanism comprising an elongated rod;
a flexure force mechanism slot generally aligned with the flexure axis and sized to snuggly fit the flexure force mechanism between a slot wall at one end of the flexure force mechanism slot and the flexure body at the other end of the flexure force mechanism slot.

7. The system of claim 4 further comprising:
the flexure is pre-stressed by the flexure force rod.

8. The system of claim 5 further comprising:
the flexure is pre-stressed by the flexure force rod.

9. The system of claim 6 further comprising:
the flexure is pre-stressed by the flexure force rod.

10. A high power narrow band, high repetition rate laser light source system line narrowing unit comprising:
a line narrowing optic mounting frame comprising a first material and a relatively flat mounting surface area;
a line narrowing optic comprising a second material having a coefficient of thermal expansion different from that of the first material of the mounting frame;
a flexure mount formed in the mounting frame that is flexible in a flexure axis corresponding to a longitudinal axis of thermal expansion of the mounting frame and the line narrowing optic;
a flexure force mechanism made of the second material or a third material having a coefficient of thermal expansion that is essentially the same as that of the second material;
the flexure force mechanism comprising an elongated rod;
a flexure force mechanism slot generally aligned with the flexure axis and sized to snuggly fit the flexure force bar between a slot wall at one end of the flexure force mechanism slot and the flexure body at the other end of the flexure force mechanism slot.

11. The system of claim 10 further comprising:
the flexure is pre-stressed with the flexure force rod.

12. The system of claim 10 further comprising:
the line narrowing optic is a grating.

13. The system of claim 11 further comprising:
the line narrowing optic is a grating.

14. The system of claim 10 further comprising:
the line narrowing optic is a tuning mirror.

15. The system of claim 11 further comprising:
the line narrowing optic is a tuning mirror.

16. A high power narrow band, high repetition rate laser light source system comprising:
a line narrowing unit having a fast moving angularly positionable tuning mirror comprising:
   a mirror mounting frame comprising a first material and a relatively flat mounting surface area;
   a reflective optic comprising a second material having a coefficient of thermal expansion different from that of the first material of the mounting frame;
   at least two attachment points of attachment between the mounting frame and the reflective optic on the mounting frame surface; and,
   at least one flexure mounting means formed in the mounting frame that is flexible in a flexure axis corresponding to a longitudinal axis of thermal expansion of the mounting frame and the reflective optic, positioned at one of the at least two points of attachment.

17. The system of claim 16, further comprising:
the flexure mounting means comprises:
   a flexure body formed from the material of the mirror mounting frame;
   at least one flexure arm formed from the material of the mirror mounting frame and attached at one end to the mirror mounting frame and at the other end to the flexure body; and
   a plurality of slots in the mirror mounting frame configured to allow relative movement between the flexure body and the mirror mounting frame.

18. The system of claim 17 further comprising:
the at least one flexure movement means comprises a first and a second flexure arm oppositely positioned on either side of the flexure body generally orthogonal to the flexure axis.

19. The system of claim 16 further comprising:
a flexure forcing means made of the second material or a third material having a coefficient of thermal expansion that is essentially the same as that of the second material;
a flexure forcing means slot generally aligned with the flexure axis and sized to snuggly fit the flexure forcing means between a slot wall at one end of the flexure forcing means slot and the flexure body at the other end of the flexure forcing means slot.

20. The system of claim 17 further comprising:
a flexure forcing means made of the second material or a third material having a coefficient of thermal expansion that is essentially the same as that of the second material;
a flexure forcing means slot generally aligned with the flexure axis and sized to snuggly fit the flexure forcing means between a slot wall at one end of the flexure forcing means slot and the flexure body at the other end of the flexure forcing means slot.

21. The system of claim 18 further comprising:
a flexure forcing means made of the second material or a third material having a coefficient of thermal expansion that is essentially the same as that of the second material;
a flexure forcing means slot generally aligned with the flexure axis and sized to snuggly fit the flexure forcing means between a slot wall at one end of the flexure forcing means slot and the flexure body at the other end of the flexure forcing means slot.

22. The system of claim 19 further comprising:
the flexure is pre-stressed by the flexure forcing means.

23. The system of claim 20 further comprising:
the flexure is pre-stressed by the flexure forcing means.

24. The system of claim 21 further comprising:
the flexure is pre-stressed by the flexure forcing means.

25. A high power narrow band, high repetition rate laser light source system line narrowing unit comprising:
a line narrowing optic mounting frame comprising a first material and a relatively flat mounting surface area;
a line narrowing optic comprising a second material having a coefficient of thermal expansion different from that of the first material of the mounting frame;
a flexure mount formed in the mounting frame that is flexible in a flexure axis corresponding to a longitudinal axis of thermal expansion of the mounting frame and the line narrowing optic;
a flexure force means made of the second material or a third material having a coefficient of thermal expansion that is essentially the same as that of the second material;
a flexure force means slot generally aligned with the flexure axis and sized to snuggly fit the flexure force means between a slot wall at one end of the flexure force means slot and the flexure body at the other end of the flexure force means slot.

26. The system of claim 25 further comprising:
the flexure is pre-stressed with the flexure force means.

27. The system of claim 25 further comprising:
the line narrowing optic is a grating.

28. The system of claim 26 further comprising:
the line narrowing optic is a grating.

29. The system of claim 25 further comprising:
the line narrowing optic is a tuning mirror.

30. The system of claim 26 further comprising:
the line narrowing optic is a tuning mirror.

31. A method for line narrowing a high power narrow band, high repetition rate laser light source comprising:
utilizing a line narrowing unit having a fast moving angularly positionable tuning mirror to tune a bandwidth spectrum comprising:
using a mirror mounting frame comprising a first material and a relatively flat mounting surface area;
using a reflective optic comprising a second material having a coefficient of thermal expansion different from that of the first material of the mounting frame;
providing at least two attachment points of attachment between the mounting frame and the reflective optic on the mounting frame surface; and,
providing at least one flexure mounting mechanism formed in the mounting frame that is flexible in a flexure axis corresponding to a longitudinal axis of thermal expansion of the mounting frame and the reflective optic, positioned at one of the at least two points of attachment.

32. The method of claim 31, further comprising:
the flexure mounting mechanism comprises:
a flexure body formed from the material of the mirror mounting frame;
at least one flexure arm formed from the material of the mirror mounting frame and attached at one end to the mirror mounting frame and at the other end to the flexure body; and
a plurality of slots in the mirror mounting frame configured to allow relative movement between the flexure body and the mirror mounting frame.

33. The method of claim 32 further comprising:
the at least one flexure movement mechanism comprises a first and a second flexure arm oppositely positioned on either side of the flexure body generally orthogonal to the flexure axis.

34. The method of claim 31 further comprising:
providing a flexure forcing mechanism made of the second material or a third material having a coefficient of thermal expansion that is essentially the same as that of the second material;
providing a flexure forcing mechanism slot generally aligned with the flexure axis and sized to snuggly fit the flexure forcing mechanism between a slot wall at one end of the flexure forcing mechanism slot and the flexure body at the other end of the flexure forcing mechanism slot.

35. The method of claim 32 further comprising:
providing a flexure forcing mechanism made of the second material or a third material having a coefficient of thermal expansion that is essentially the same as that of the second material;
providing a flexure forcing mechanism slot generally aligned with the flexure axis and sized to snuggly fit the flexure forcing mechanism between a slot wall at one end of the flexure forcing mechanism slot and the flexure body at the other end of the flexure forcing mechanism slot.

36. The method of claim 33 further comprising:
providing a flexure forcing mechanism made of the second material or a third material having a coefficient of thermal expansion that is essentially the same as that of the second material;
providing a flexure forcing mechanism slot generally aligned with the flexure axis and sized to snuggly fit the flexure forcing mechanism between a slot wall at one end of the flexure forcing mechanism slot and the flexure body at the other end of the flexure forcing mechanism slot.

37. The method of claim 34 further comprising:
the flexure is pre-stressed by the flexure forcing mechanism.

38. The method of claim 35 further comprising:
the flexure is pre-stressed by the flexure forcing mechanism.

39. The method of claim 36 further comprising:
the flexure is pre-stressed by the flexure forcing mechanism.

40. A high power narrow band, high repetition rate laser light source system line narrowing method comprising:
- utilizing a line narrowing optic mounting frame comprising a first material and a relatively flat mounting surface area;
- utilizing a line narrowing optic comprising a second material having a coefficient of thermal expansion different from that of the first material of the mounting frame;
- providing a flexure mount formed in the mounting frame that is flexible in a flexure axis corresponding to a longitudinal axis of thermal expansion of the mounting frame and the line narrowing optic;
- providing a flexure force mechanism made of the second material or a third material having a coefficient of thermal expansion that is essentially the same as that of the second material;
- providing a flexure force mechanism slot generally aligned with the flexure axis and sized to snuggly fit the flexure force mechanism between a slot wall at one end of the flexure force mechanism slot and the flexure body at the other end of the flexure force mechanism slot.

41. The method of claim 40 further comprising:
pre-stressing the flexure with the flexure force mechanism.

42. The method of claim 40 further comprising:
the line narrowing optic is a grating.

43. The method of claim 41 further comprising:
the line narrowing optic is a grating.

44. The method of claim 40 further comprising:
the line narrowing optic is a tuning mirror.

45. The method of claim 41 further comprising:
the line narrowing optic is a tuning mirror.

46. A high power narrow band, high repetition rate laser light source system line narrowing unit comprising:
- a line narrowing optic mounting frame comprising a first material and a relatively flat mounting surface area;
- a line narrowing optic comprising a second material having a coefficient of thermal expansion different from that of the first material of the mounting frame;
- a flexure mount formed in the mounting frame that is flexible in a flexure axis corresponding to a longitudinal axis of thermal expansion of the mounting frame and the line narrowing optic;
- a flexure force mechanism made of the second material or a third material having a coefficient of thermal expansion that is essentially the same as that of the second material;
- the flexure force mechanism comprising an elongated rod;
- a flexure force mechanism slot generally aligned with the flexure axis and sized to snuggly fit the flexure force bar between a slot wall at one end of the flexure force mechanism slot and the flexure body at the other end of the flexure force mechanism slot;
- a lateral expander made of the second material and comprising at least one mounting point for the line narrowing optic.

* * * * *